(12) United States Patent
Akai et al.

(10) Patent No.: US 12,172,240 B2
(45) Date of Patent: Dec. 24, 2024

(54) SOLDER PARTICLES

(71) Applicant: Showa Denko Materials Co., Ltd., Tokyo (JP)

(72) Inventors: Kunihiko Akai, Tokyo (JP); Yoshinori Ejiri, Tokyo (JP); Yuuhei Okada, Tokyo (JP); Toshimitsu Moriya, Tokyo (JP); Shinichirou Sukata, Tokyo (JP); Masayuki Miyaji, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 786 days.

(21) Appl. No.: 17/255,982

(22) PCT Filed: Jun. 26, 2019

(86) PCT No.: PCT/JP2019/025499
§ 371 (c)(1),
(2) Date: Dec. 23, 2020

(87) PCT Pub. No.: WO2020/004513
PCT Pub. Date: Jan. 2, 2020

(65) Prior Publication Data
US 2021/0114145 A1    Apr. 22, 2021

(30) Foreign Application Priority Data

Jun. 26, 2018 (JP) .................... 2018-121088
Jan. 30, 2019 (JP) .................... 2019-014853

(51) Int. Cl.
*B23K 35/02* (2006.01)
*B22F 1/00* (2022.01)
(Continued)

(52) U.S. Cl.
CPC ............ *B23K 35/0244* (2013.01); *B22F 1/00* (2013.01); *B23K 35/262* (2013.01); *B23K 2103/08* (2018.08)

(58) Field of Classification Search
CPC ..... C22C 13/00; C22C 28/00; B23K 2103/08; B23K 35/262; B23K 35/0244
See application file for complete search history.

(56) References Cited

U.S. PATENT DOCUMENTS 5,527,628 A    6/1996  Anderson et al.
5,542,174 A    8/1996  Chiu
(Continued)

FOREIGN PATENT DOCUMENTS

CN    1505550    6/2004
CN    1642392    7/2005
(Continued)

OTHER PUBLICATIONS

Amoabeng, Derrick, and Sachin S. Velankar. "Bulk soldering: Conductive polymer composites filled with copper particles and solder." Colloids and Surfaces A: Physicochemical and Engineering Aspects 553 (2018): 624-632.*

*Primary Examiner* — Jessee R Roe
(74) *Attorney, Agent, or Firm* — JCIPRNET

(57) ABSTRACT

The present invention relates to solder particles, each of which partially has a flat portion in the surface. By using these solder particles, electrodes facing each other are able to be appropriately connected, thereby achieving an anisotropic conductive material that exhibits excellent conduction reliability and excellent insulation reliability.

11 Claims, 8 Drawing Sheets

(51) Int. Cl.
   *B23K 35/26* (2006.01)
   *B23K 103/08* (2006.01)

(56) References Cited

U.S. PATENT DOCUMENTS

| | | |
|---|---|---|
| 6,025,258 A | 2/2000 | Ochiai et al. |
| 6,077,380 A | 6/2000 | Hayes et al. |
| 6,293,456 B1 | 9/2001 | MacKay et al. |
| 6,660,944 B1 * | 12/2003 | Murata ............... H01L 21/4853 174/250 |
| 6,802,446 B2 | 10/2004 | Chaudhuri et al. |
| 7,134,879 B2 | 11/2006 | Sugimoto et al. |
| 10,199,358 B2 | 2/2019 | Akutsu et al. |
| 10,624,215 B2 | 4/2020 | Tanaka |
| 11,001,686 B2 | 5/2021 | Miyake et al. |
| 2001/0008250 A1 | 7/2001 | Hembree |
| 2002/0100972 A1 | 8/2002 | Kitajima et al. |
| 2003/0102101 A1 | 6/2003 | Farnworth |
| 2004/0016456 A1 | 1/2004 | Murozono et al. |
| 2004/0110366 A1 | 6/2004 | MacKay et al. |
| 2008/0173398 A1 | 7/2008 | Yasuda et al. |
| 2008/0284046 A1 | 11/2008 | Karashima et al. |
| 2009/0180914 A1 | 7/2009 | Tobita et al. |
| 2010/0053924 A1 | 3/2010 | Ueshima |
| 2014/0083740 A1 | 3/2014 | Ishizawa et al. |
| 2014/0191382 A1 | 7/2014 | Asami |
| 2015/0008022 A1 | 1/2015 | Masui et al. |
| 2015/0214176 A1 | 7/2015 | Shinohara |
| 2017/0246711 A1 | 8/2017 | Kawasaki et al. |
| 2017/0309590 A1 | 10/2017 | Tsukao |
| 2018/0218990 A1 | 8/2018 | Akutsu et al. |
| 2019/0206587 A1 | 7/2019 | Sou et al. |
| 2019/0293683 A1 | 9/2019 | Hayashi et al. |
| 2020/0299474 A1 | 9/2020 | Tsukao |
| 2021/0082798 A1 | 3/2021 | Lu et al. |
| 2021/0114147 A1 | 4/2021 | Akai et al. |
| 2021/0238456 A1 | 8/2021 | Matsubara |

FOREIGN PATENT DOCUMENTS

| | | |
|---|---|---|
| CN | 1253279 | 4/2006 |
| CN | 102272863 | 12/2011 |
| CN | 102415225 | 4/2012 |
| CN | 103189159 | 7/2013 |
| CN | 104541416 | 4/2015 |
| CN | 105900224 | 8/2016 |
| CN | 106486183 | 3/2017 |
| CN | 106688051 | 5/2017 |
| CN | 107077914 | 8/2017 |
| CN | 107112657 | 8/2017 |
| CN | 107267076 | 10/2017 |
| JP | H01184201 | 7/1989 |
| JP | H0523887 | 2/1993 |
| JP | H0927676 | 1/1997 |
| JP | H0982713 | 3/1997 |
| JP | H09150296 | 6/1997 |
| JP | 3869785 | 1/2007 |
| JP | 2010036234 | 2/2010 |
| JP | 4773685 | 9/2011 |
| JP | 2014017213 | 1/2014 |
| JP | 2014060368 | 4/2014 |
| JP | 2015136735 | 7/2015 |
| JP | 2016076494 | 5/2016 |
| JP | 2016126878 | 7/2016 |
| JP | 6187665 | 8/2017 |
| JP | 2017195180 | 10/2017 |
| JP | 7452419 | 3/2024 |
| TW | 200632134 | 9/2006 |
| TW | 201530562 | 8/2015 |
| TW | 201546828 | 12/2015 |
| TW | 201721660 | 6/2017 |
| WO | 03035308 | 5/2003 |

\* cited by examiner (a)

(b)

(c)

(d)

SOLDER PARTICLES

CROSS-REFERENCE TO RELATED APPLICATION

This application is a 371 application of the International PCT application serial no. PCT/JP2019/025499 filed on Jun. 26, 2019, which claims the priority benefits of Japan Patent Application No. 2018-121088, filed on Jun. 26, 2018 and Japan Patent Application No. 2019-014853, filed on Jan. 30, 2019. The entirety of each of the above-mentioned patent applications is hereby incorporated by reference herein and made a part of this specification.

TECHNICAL FIELD

The present invention relates to solder particles.

BACKGROUND ART

In the related art, use of solder particles as conductive particles mixed into anisotropic conductive materials such as anisotropic conductive films and anisotropic conductive pastes has been studied. For example, in Patent Literature 1, a conductive paste containing a thermosetting component and a plurality of solder particles subjected to a specific surface treatment is described.

REFERENCE LIST

Patent Literature

Patent Literature 1: Japanese Patent Laid-Open No. 2016-76494

SUMMARY OF INVENTION

Technical Problem

In recent years, connecting parts have been miniaturized further, and as the definition of circuit members has become higher, the conduction reliability and the insulation reliability required for anisotropic conductive materials have increased. In order to secure conduction reliability and insulation reliability, it is necessary for conductive particles mixed into an anisotropic conductive material to allow appropriate electrical connection between electrodes that face each other, but it is currently not always possible to realize this with an anisotropic conductive material containing solder particles in the related art.

The present invention has been made in view of the above circumstances, and an objective of the present invention is to provide solder particles that allow an anisotropic conductive material having excellent conduction reliability and insulation reliability to be obtained.

Solution to Problem

One aspect of the present invention relates to solder particles having a flat portion on a part of the surface. When such solder particles are used, it is possible to obtain an anisotropic conductive material having excellent conduction reliability and insulation reliability.

In one aspect, the average particle diameter of the solder particles may be 1 to 30 μm and the C.V. value may be 20% or less.

In one aspect, a ratio (A/B) of a diameter A of the flat portion to a diameter B of the solder particles may satisfy the following formula:

$$0.01 < A/B < 1.0.$$

In one aspect, a quadrangle circumscribing a projected image of a solder particle is created by two pairs of parallel lines, and distances between opposite sides are set as X and Y (where Y<X), X and Y may satisfy the following formula:

$$0.8 < Y/X < 1.0.$$

In one aspect, the solder particles may include at least one selected from the group consisting of tin, tin alloys, indium and indium alloys.

In one aspect, the solder particles may include at least one selected from the group consisting of In—Sn alloys, In—Sn—Ag alloys, In—Bi alloys, Sn—Au alloys, Sn—Bi alloys, Sn—Bi—Ag alloys, Sn—Ag—Cu alloys and Sn—Cu alloys.

Advantageous Effects of Invention

According to the present invention, there are provided solder particles that allow an anisotropic conductive material having excellent conduction reliability and insulation reliability to be obtained.

Figure 3:
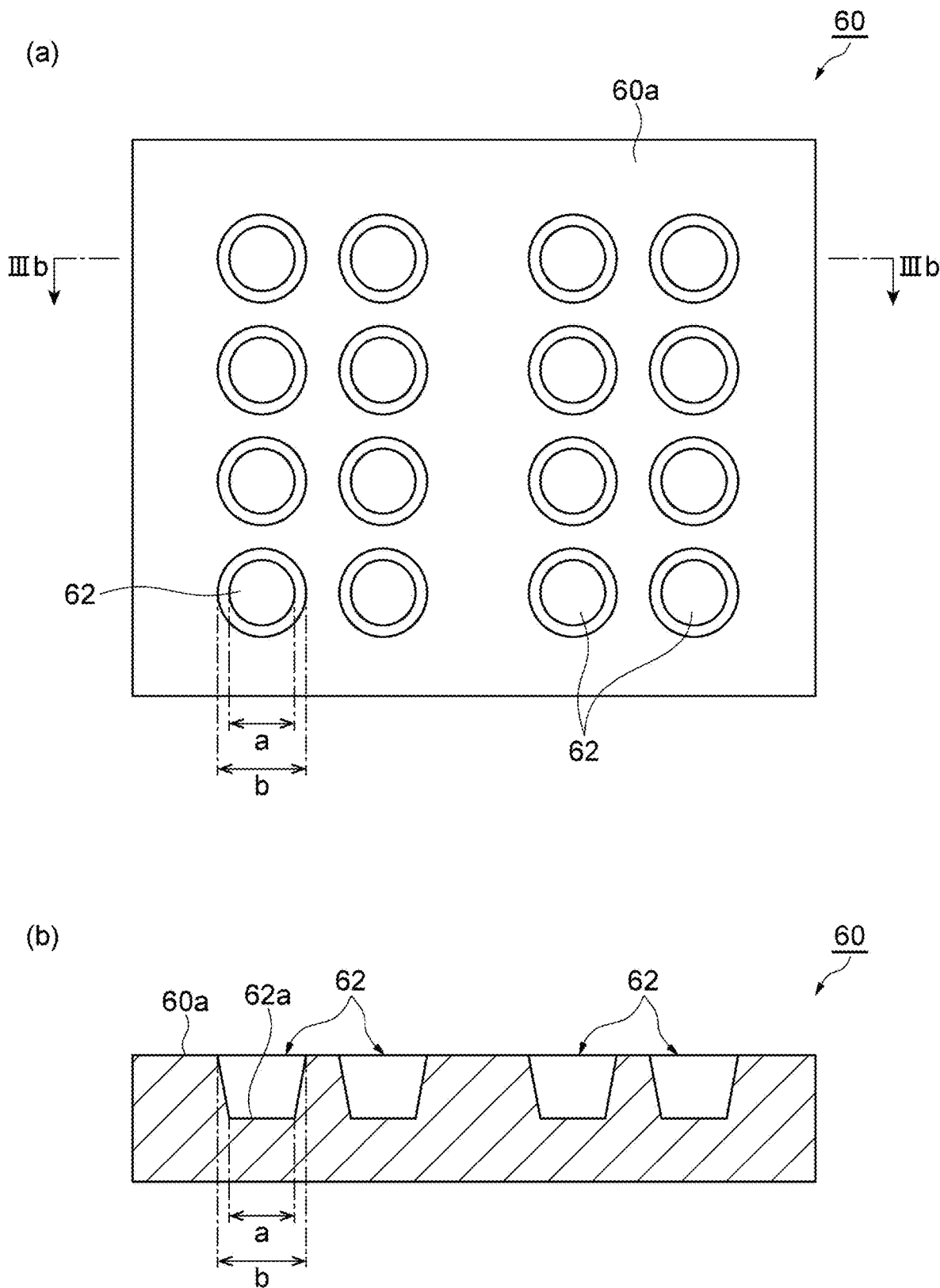

(a) of FIG. 3 is a plan view schematically showing an example of a base material and (b) of FIG. 3 is a cross-sectional view taken along the line IIIb-IIIb shown in (a) of FIG. 3.

Figure 4:
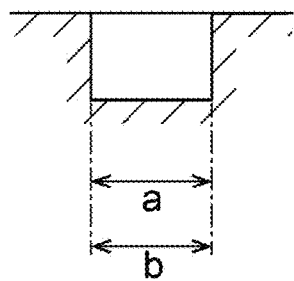
Figure 4:
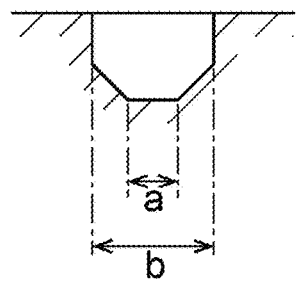
Figure 4:
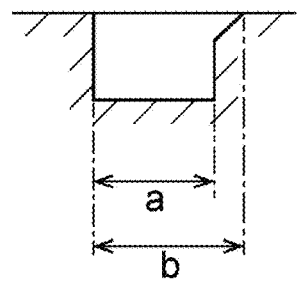
Figure 4:
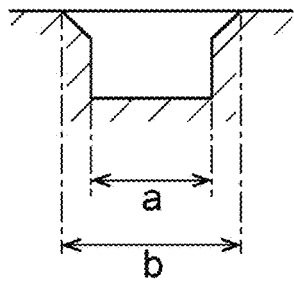

(a) of FIG. 4 to (d) of FIG. 4 are cross-sectional views schematically showing an example of a cross-sectional shape of recesses of the base material.

Figure 5:
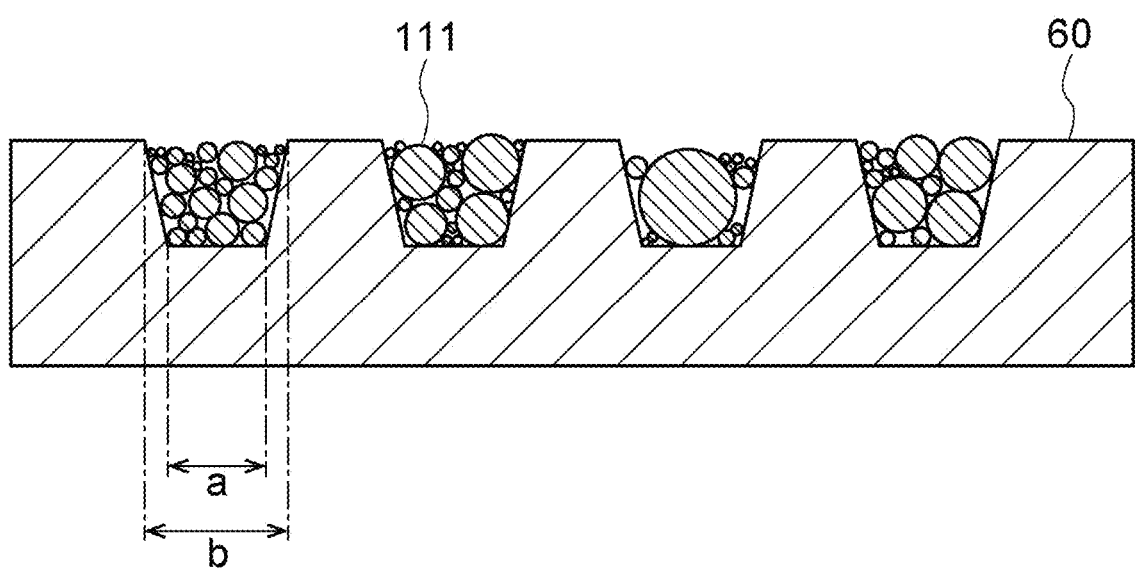

FIG. 5 is a cross-sectional view schematically showing a state in which solder fine particles are accommodated in recesses of the base material.

Figure 6:
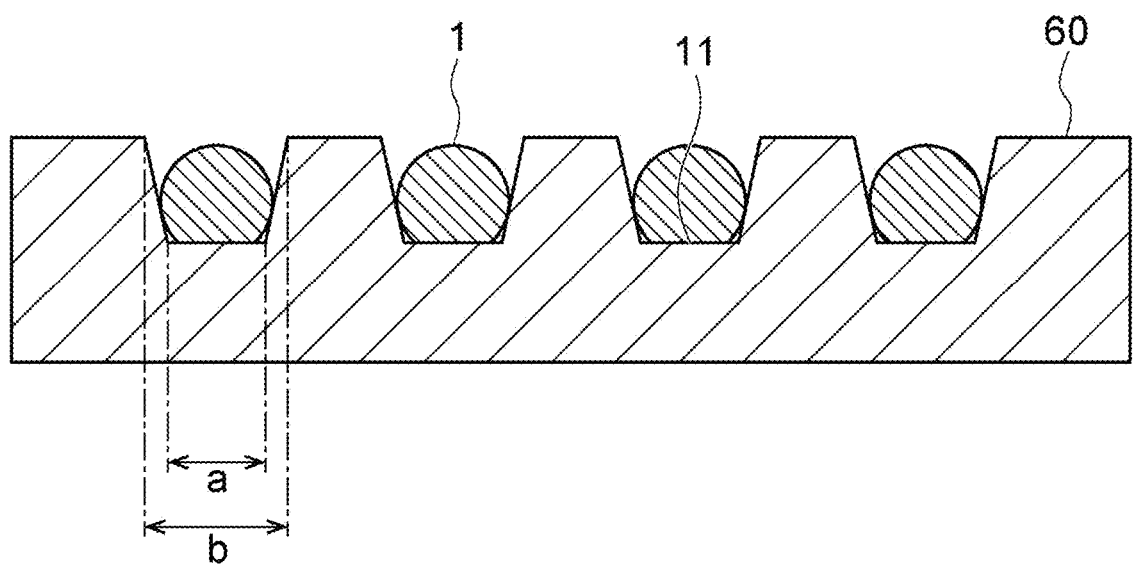

FIG. 6 is a cross-sectional view schematically showing a state in which solder particles are formed in recesses of the base material.

Figure 7:
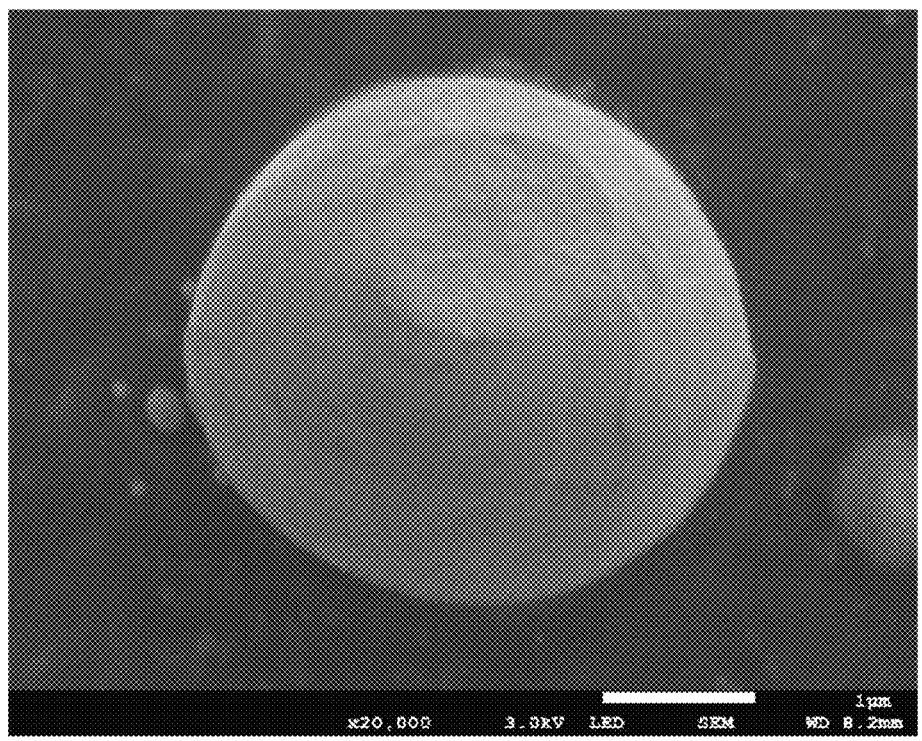

FIG. 7 is an SEM image of solder particles obtained in Example 1.

Figure 8:
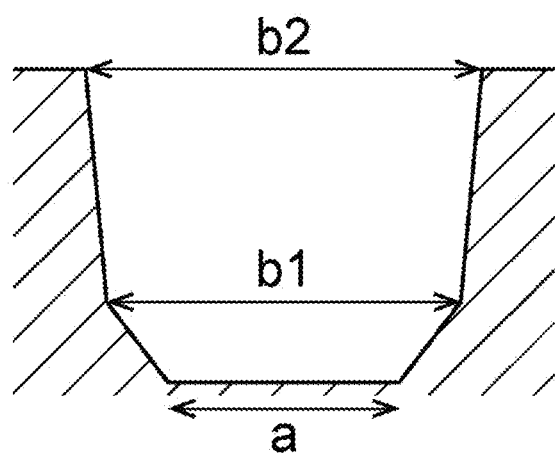

FIG. 8 is a cross-sectional view schematically showing another example of a cross-sectional shape of the recess of the base material.

DESCRIPTION OF EMBODIMENTS

Hereinafter, embodiments of the present invention will be described. The present invention is not limited to the following embodiments. Here, unless otherwise specified, materials exemplified below may be used alone or two or more thereof may be used in combination. When there are a plurality of substances corresponding to components in a composition, the content of the components in the composition means a total amount of the plurality of substances present in the composition unless otherwise specified. A numerical range indicated using "to" means a range including numerical values stated before and after "to" as a minimum value and a maximum value. In the numerical ranges described stepwise in this specification, an upper limit value or a lower limit value of a certain stepwise numerical range may be replaced with an upper limit value or a lower limit value of other stepwise numerical ranges. In the numerical ranges described in this specification, the upper limit value or the lower limit value of the numerical range may be replaced with values shown in examples.

<Solder Particles>

The solder particles according to the present embodiment have a flat portion on a part of the surface. In this case, a surface other than the flat portion preferably has a spherical crown shape. That is, the solder particles may have a flat portion and a spherical crown-shaped curved surface. When an anisotropic conductive material is obtained using such solder particles, it is possible to realize excellent conduction reliability and insulation reliability. The reason for this will be described below.

First, when a flat portion of solder particles comes in contact with an electrode, a large contact area can be secured between the flat portion and the electrode. For example, when an electrode made of a material which solder easily wets and spread on and an electrode made of a material which solder does not easily wet and spread on are connected, the connection between the two electrodes can be suitably performed by performing adjustment so that flat portions of the solder particles are arranged on the side of the latter electrode.

In addition, when a contact area between the solder particles and the electrodes is larger, the solder wets and spreads more easily. For example, regarding a method for allowing solder particles disposed on an electrode (substrate) to wet and spread on the electrode, there is a method in which a flux is applied to solder particles themselves or onto an electrode in advance and the solder particles are dissolved by reflowing (heating). At this time, in the case of an oxide film of the solder particles is thick and the flux is weak or the like, when a contact area between the solder particles and the electrodes is small, the solder does not easily wet and spread. On the other hand, when a flat portion is formed on a part of the surface of solder particles, a contact area between the electrodes and the solder particles becomes larger, and wetting and spreading tend to easily occur. This is considered to be because, when removal of the oxide film is in progress and the electrodes and the surface of the solder particles come in contact, the thinned oxide film becomes cracked, the dissolved solder or flux flows, and the oxide film is easily removed. In this manner, when a contact area between the solder particles and the electrodes becomes larger, since the number of contact points between the electrodes and the surface of the solder particles increases, the time at which wetting and spreading occur becomes earlier and wetting and spreading easily occur. Here, since the solder particles easily wet and spread, the amount of flux can be reduced and the occurrence of ion migration due to residual flux can be curbed.

In addition, since solder particles having a flat portion have a favorable fitting ability, when the solder particles are disposed on the electrode so that the flat portion is in contact with the electrode, the stable shape makes it difficult for the solder particles to be displaced. That is, it is easy to prevent the solder particles from rolling off of the electrodes before reflow, which causes a decrease in conduction reliability between electrodes that face each other and a decrease in insulation reliability between adjacent electrodes.

Figure 1:
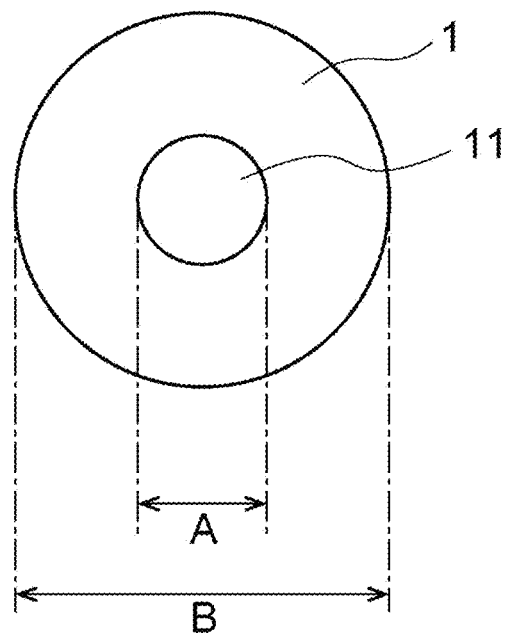
FIG. 1 is a diagram schematically showing an example of solder particles.

FIG. 1 is a diagram schematically showing an example of solder particles 1 according to the present embodiment. As shown in FIG. 1, the solder particles 1 have a shape in which a flat portion 11 having a diameter A is formed on a part of the surface of a sphere having a diameter B. In order to realize excellent conduction reliability and insulation reliability, the ratio (A/B) of the diameter A of the flat portion to the diameter B of the solder particles 1 may be, for example, more than 0.01 and less than 1.0 (0.01<A/B<1.0), and may be 0.1 to 0.9. The diameter B of the solder particles and the diameter A of the flat portion can be observed using, for example, a scanning electron microscope.

Specifically, an arbitrary particle is observed under a scanning electron microscope and an image is captured. The diameter B of the solder particle and the diameter A of the flat portion are measured from the obtained image, and A/B of the particle is obtained. This operation is performed on 300 solder particles, and an average value is calculated and used as A/B of the solder particles.

The solder particles 1 may have an average particle diameter of 1 to 30 µm and a C.V. value of 20% or less. Such solder particles have both a small average particle diameter and a narrow particle size distribution, and can be suitably used as conductive particles applied to an anisotropic conductive material having high conduction reliability and insulation reliability.

The average particle diameter of the solder particles is not particularly limited as long as it is within the above range, and is preferably 30 µm or less, more preferably 25 µm or less, and still more preferably 20 µm or less. In addition, the average particle diameter of the solder particles is preferably 1 µm or more, more preferably 2 µm or more, and still more preferably 4 µm or more.

The average particle diameter of the solder particles can be measured using various methods according to the size. Methods such as, for example, a dynamic light scattering method, a laser diffraction method, a centrifugal sedimentation method, an electrical detection band method, and a resonance type mass measurement method, can be used. In addition, a method of measuring a particle size from an image obtained by an optical microscope, an electron microscope or the like can be used. Examples of specific devices include a flow type particle image analyzing device, a Microtrac, and a Coulter counter.

In order to realize better conduction reliability and insulation reliability, the C.V. value of the solder particles is preferably 20% or less, more preferably 10% or less, still more preferably 7% or less, and most preferably 5% or less. In addition, the lower limit of the C.V. value of the solder particles is not particularly limited.

For example, the C.V. value of the solder particles may be 1% or more or 2% or more.

The C.V. value of the solder particles is calculated by multiplying a value obtained by dividing the standard deviation of the particle diameter measured by the above method by the average particle diameter by 100.

When a quadrangle circumscribing a projected image of a solder particle is created by two pairs of parallel lines and distances between opposite sides are set as X and Y (where Y<X), the ratio (Y/X) of Y to X may be more than 0.8 and less than 1.0 (0.8<Y/X<1.0) or may be 0.81 to 0.99. Such solder particles can then be particles closer to true spheres. In the case of the solder particles are accommodated in recesses 62 of a base material 60 again, when the solder particles are close to spherical shapes, they tend to be easily accommodatable. In addition, since the solder particles are close to true spheres, when a plurality of electrodes that face each other are electrically connected via the solder particles, the contact between the solder particles and the electrodes is less likely to be uneven, and a stable connection tends to be obtained. In addition, when a conductive film or paste in which solder particles are dispersed in a resin material is produced, high dispersibility is obtained and dispersion stability during production tends to be obtained. In addition, in a case of a film or paste in which solder particles are dispersed in a resin material is used for connection between electrodes, even if the solder particles rotate in the resin, when the solder particles have a spherical shape, projected areas of the solder particles are close to each other when viewed in a projected image. Therefore, a stable electrical connection with little variation during connection of electrodes tends to be obtained.

Figure 2:
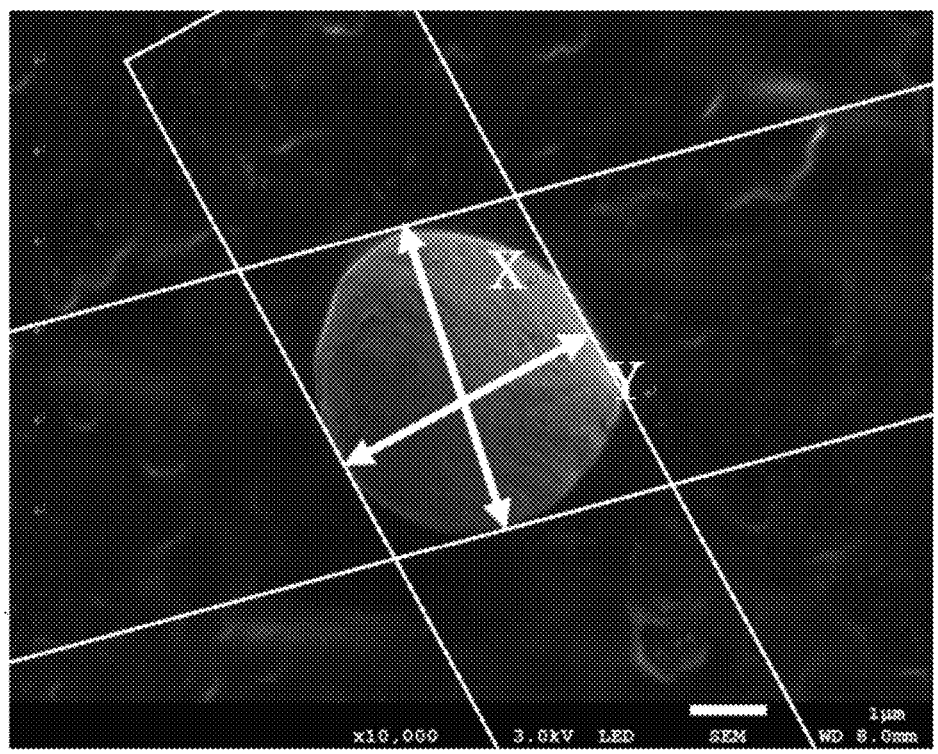
FIG. 2 is a diagram showing distances X and Y (where Y≤X) between opposite sides when a quadrangle circumscribing a projected image of a solder particle is created by two pairs of parallel lines.

FIG. 2 is a diagram showing distances X and Y between opposite sides (where Y<X) when a quadrangle circumscribing a projected image of a solder particle is created by two pairs of parallel lines. For example, an arbitrary particle may be observed under a scanning electron microscope and a projected image is obtained. Two pairs of parallel lines are drawn on the obtained projected image, one pair of parallel lines is arranged at a position at which the distance between the parallel lines is a minimum, the other pair of parallel lines is arranged at a position at which the distance between the parallel lines is a maximum, and Y/X of the particles is obtained. This operation is performed on 300 solder particles, and an average value is calculated and used as Y/X of the solder particles.

The solder particles may contain tin or a tin alloy. Regarding the tin alloy, for example, In—Sn alloys, In—Sn—Ag alloys, Sn—Au alloys, Sn—Bi alloys, Sn—Bi—Ag alloys, Sn—Ag—Cu alloys, and Sn—Cu alloys can be used. Specific examples of these tin alloys include the following examples.

In—Sn (In 52 mass %, Bi 48 mass %, melting point 118° C.)
In—Sn—Ag (In 20 mass %, Sn 77.2 mass %, Ag 2.8 mass %, melting point of 175° C.)
Sn—Bi (Sn 43 mass %, Bi 57 mass %, melting point of 138° C.)
Sn—Bi—Ag (Sn 42 mass %, Bi 57 mass %, Ag 1 mass %, melting point of 139° C.)
Sn—Ag—Cu (Sn 96.5 mass %, Ag 3 mass %, Cu 0.5 mass %, melting point of 217° C.)
Sn—Cu (Sn 99.3 mass %, Cu 0.7 mass %, melting point of 227° C.)
Sn—Au (Sn 21.0 mass %, Au 79.0 mass %, melting point of 278° C.)

The solder particles may contain indium or an indium alloy. Regarding the indium alloy, for example, In—Bi alloys and In—Ag alloys can be used. Specific examples of these indium alloys include the following examples.

In—Bi (In 66.3 mass %, Bi 33.7 mass %, melting point of 72° C.)
In—Bi (In 33.0 mass %, Bi 67.0 mass %, melting point of 109° C.)
In—Ag (In 97.0 mass %, Ag 3.0 mass %, melting point of 145° C.)

The tin alloy or indium alloy can be selected according to applications of the solder particles (temperature during use). For example, when solder particles are used for fusion at a low temperature, In—Sn alloys and Sn—Bi alloys may be used, and in this case, solder particles can be fused at 150° C. or lower. When a material having a high melting point such as Sn—Ag—Cu alloys and Sn—Cu alloys is used, it is possible to maintain high reliability even after being left at a high temperature.

The solder particles may contain at least one selected from among Ag, Cu, Ni, Bi, Zn, Pd, Pb, Au, P and B. Among these elements, Ag or Cu may be contained in consideration of the following aspect. That is, when the solder particles contain Ag or Cu, the melting point of the solder particles can be lowered to about 220° C. and the bond strength with respect to an electrode is further improved, and thus more favorable conduction reliability is easily obtained.

The Cu content of the solder particles is, for example, 0.05 to 10 mass %, and may be 0.1 to 5 mass % or 0.2 to 3 mass %. When the Cu content is 0.05 mass % or more, more favorable solder connection reliability is easily achieved. In addition, when the Cu content is 10 mass % or less, solder particles having a low melting point and excellent wettability are easily obtained, and as a result, the reliability of connection of the bonding part to the solder particles tends to be favorable.

The Ag content of the solder particles is, for example, 0.05 to 10 mass %, and may be 0.1 to 5 mass % or 0.2 to 3 mass %. When the Ag content is 0.05 mass % or more, more favorable solder connection reliability is easily achieved. In addition, when the Ag content is 10 mass % or less, solder particles having a low melting point and excellent wettability are easily obtained, and as a result, the reliability of connection of the bonding part to the solder particles tends to be favorable.

The applications of the solder particles are not particularly limited, and for example, the solder particles can be suitably used as conductive particles for an anisotropic conductive material. In addition, the solder particles can be suitably used for applications such as electrically connecting electrodes in a ball grid array connection method (BGA connection) that is widely used for mounting a semiconductor integrated circuit and applications such as sealing components such as a microelectro mechanical system (MEMS) and pipe sealing, brazing, and height and clearance control spacers. That is, the solder particles can be used for general applications in which conventional solder is used.

<Method for Producing Solder Particles>

A method for producing solder particles according to the present embodiment is not particularly limited, and an example of the production method will be described below. For example, solder particles according to the present embodiment can be produced by a method for producing solder particles including a preparation step in which a base material having a plurality of recesses and solder fine particles are prepared, an accommodation step in which at least some of the solder fine particles are accommodated in the recesses of the base material, and a fusing step in which the solder fine particles accommodated in the recesses are fused and the solder particles are formed inside the recesses. According to this production method, solder particles having a flat portion on a part of the surface are produced.

A method for producing solder particles will be described below with reference to FIGS. 3 to 6.

First, solder fine particles and a base material 60 in which solder fine particles are contained are prepared. (a) of FIG. 3 is a plan view schematically showing an example of the base material 60 and (b) of FIG. 3 is a cross-sectional view taken along the line IIIb-IIIb shown in (a) of FIG. 3. The base material 60 shown in (a) of FIG. 3 has a plurality of recesses 62. The plurality of recesses 62 may be regularly arranged in a predetermined pattern. In this case, after solder particles are formed in the recesses 62, the solder particles in the recesses 62 are transferred to a resin material or the like, and thus the solder particles can be regularly arranged.

The recesses 62 of the base material 60 are preferably formed in a tapered shape in which an opening area enlarges from the side of a bottom 62a of the recesses 62 toward the side of a surface 60a of the base material 60. That is, as shown in FIG. 3, the width (a width a in FIG. 3) of the bottom 62a of the recesses 62 is preferably narrower than the width (a width b in FIG. 3) of an opening on the surface 60a of the recesses 62. In addition, the size (a width a, a width b, a volume, a taper angle, a depth, etc.) of the recesses 62 may be set according to the size of desired solder particles.

Here, the shape of the recesses 62 may be a shape other than the shape shown in FIG. 3. For example, the shape of the opening on the surface 60a of the recesses 62 may be an ellipse, a triangle, a quadrangle, a polygon or the like, in addition to a circle as shown in FIG. 3.

In addition, the shape of the recesses 62 in the cross section perpendicular to the surface 60a may be, for example, a shape shown in FIG. 4. (a) of FIG. 4 to (d) of FIG. 4 are cross-sectional views schematically showing an example of a cross-sectional shape of the recess of the base material. The bottom surface of each of the cross-sectional shapes shown in (a) of FIG. 4 to (d) of FIG. 4 is flat. Thereby, a flat portion is formed on a part of the surface of the solder particles. In addition, in any of the cross-sectional shapes shown in (a) of FIG. 4 to (d) of FIG. 4, the width (the width b) of the opening on the surface 60a of the recesses 62 is the maximum width in the cross-sectional shape. Thereby, it is easy to remove the solder particles formed in the recesses 62, and thus the workability is improved.

Regarding the material constituting the base material 60, for example, an inorganic material such as silicon, various ceramics, glass, and a metal such as stainless steel, and an organic material such as various resins can be used. Among these, the base material 60 is preferably formed of a heat-resistant material that does not deteriorate at a melting temperature of the solder fine particles. In addition, the recesses 62 of the base material 60 can be formed by a known method such as a photolithography method, an imprint method, a machining method, an electron beam processing method, and a radiation processing method.

The solder fine particles prepared in the preparation step may include fine particles having a particle diameter smaller than the width (the width b) of the opening on the surface 60a of the recesses 62, and preferably include more fine particles having a particle diameter smaller than the width b. For example, in the solder fine particles, the D10 particle diameter of the particle size distribution is preferably smaller than the width b, the D30 particle diameter of the particle size distribution is more preferably smaller than the width b, and the D50 particle diameter of the particle size distribution is still more preferably smaller than the width b.

The particle size distribution of the solder fine particles can be measured using various methods according to the size. Methods, for example, a dynamic light scattering method, a laser diffraction method, a centrifugal sedimentation method, an electrical detection band method, and a resonance type mass measurement method, can be used. In addition, a method of measuring a particle size from an image obtained by an optical microscope, an electron microscope or the like can be used. Examples of specific devices include a flow type particle image analyzing device, a Microtrac, and a Coulter counter.

The C.V. value of the solder fine particles prepared in the preparation step is not particularly limited, and in order to improve filling into the recesses 62 according to a combination of large and small fine particles, a high C.V. value is preferable. For example, the C.V. value of the solder fine particles may be more than 20%, and is preferably 25% or more and more preferably 30% or more.

The C.V. value of the solder fine particles is calculated by multiplying a value obtained by dividing the standard deviation of particle diameters measured by the above method by the average particle diameter (D50 particle diameter) by 100.

The solder fine particles may contain tin or a tin alloy. Regarding the tin alloy, for example, In—Sn alloys, In—Sn—Ag alloys, Sn—Au alloys, Sn—Bi alloys, Sn—Bi—Ag alloys, Sn—Ag—Cu alloys, and Sn—Cu alloys can be used. Specific examples of these tin alloys include the following examples.

In—Sn (In 52 mass %, Bi 48 mass %, melting point of 118° C.)
In—Sn—Ag (In 20 mass %, Sn 77.2 mass %, Ag 2.8 mass %, melting point of 175° C.)
Sn—Bi (Sn 43 mass %, Bi 57 mass %, melting point of 138° C.)
Sn—Bi—Ag (Sn 42 mass %, Bi 57 mass %, Ag 1 mass %, melting point of 139° C.)
Sn—Ag—Cu (Sn 96.5 mass %, Ag 3 mass %, Cu 0.5 mass %, melting point of 217° C.)
Sn—Cu (Sn 99.3 mass %, Cu 0.7 mass %, melting point of 227° C.)
Sn—Au (Sn 21.0 mass %, Au 79.0 mass %, melting point of 278° C.)

The solder particles may contain indium or an indium alloy. Regarding the indium alloy, for example, In—Bi alloys and In—Ag alloys can be used. Specific examples of these indium alloys include the following examples.

In—Bi (In 66.3 mass %, Bi 33.7 mass %, melting point of 72° C.)
In—Bi (In 33.0 mass %, Bi 67.0 mass %, melting point of 109° C.)
In—Ag (In 97.0 mass %, Ag 3.0 mass %, melting point of 145° C.)

The tin alloy or indium alloy can be selected according to applications of the solder particles (temperature during use). For example, when it is desired to obtain solder particles used for fusion at a low temperature, In—Sn alloys and Sn—Bi alloys may be used, and in this case, solder particles that can be fused at 150° C. or lower are obtained. When a material having a high melting point such as Sn—Ag—Cu alloys and Sn—Cu alloys is used, solder particles that can maintain high reliability even after being left at a high temperature can be obtained.

The solder fine particles may contain at least one selected from among Ag, Cu, Ni, Bi, Zn, Pd, Pb, Au, P and B. Among these elements, Ag or Cu may be contained in consideration of the following aspect. That is, when the solder fine particles contain Ag or Cu, effects in which the melting point of the obtained solder particles can be lowered to about 220° C. and the solder particles having an excellent bond strength with respect to an electrode are obtained, and thus favorable conduction reliability is obtained are obtained.

The Cu content of the solder fine particles is, for example, 0.05 to 10 mass %, and may be 0.1 to 5 mass % or 0.2 to 3 mass %. When the Cu content is 0.05 mass % or more, it is easy to obtain solder particles that allow favorable solder connection reliability to be achieved. In addition, when the Cu content is 10 mass % or less, solder particles having a low melting point and excellent wettability are easily obtained, and as a result, the reliability of connection of the bonding part to the solder particles tends to be favorable.

The Ag content of the solder fine particles is, for example, 0.05 to 10 mass %, and may be 0.1 to 5 mass % or 0.2 to 3 mass %. When the Ag content is 0.05 mass % or more, it is easy to obtain solder particles that allow favorable solder connection reliability to be achieved. In addition, when the Ag content is 10 mass % or less, solder particles having a low melting point and excellent wettability are easily obtained, and as a result, the reliability of connection of the bonding part to the solder particles tends to be favorable.

In the accommodation step, the solder fine particles prepared in the preparation step are accommodated in each of the recesses 62 of the base material 60. The accommodation step may be a step in which all of the solder fine particles prepared in the preparation step are accommodated in the recesses 62 or a step in which some of the solder fine particles prepared in the preparation step (for example, those having a diameter smaller than the width b of the opening of the recesses 62 among the solder fine particles) are accommodated in the recesses 62.

FIG. 5 is a cross-sectional view schematically showing a state in which solder fine particles 111 are accommodated in the recesses 62 of the base material 60. As shown in FIG. 5, the plurality of solder fine particles 111 are accommodated in each of the plurality of recesses 62.

For example, the amount of the solder fine particles 111 accommodated in the recesses 62 is preferably 20% or more, more preferably 30% or more, still more preferably 50% or more, and most preferably 60% or more with respect to the volume of the recesses 62. Thereby, the variation in the accommodation amount is minimized and solder particles having a smaller particle size distribution are easily obtained.

A method of accommodating solder fine particles in the recesses 62 is not particularly limited. The accommodation method may be any of a dry type and a wet type. For example, when the solder fine particles prepared in the preparation step are placed on the base material 60 and the surface 60a of the base material 60 is rubbed with a squeegee, excess solder fine particles can be removed and sufficient solder fine particles can be accommodated in the recesses 62. When the width b of the opening of the recesses 62 is larger than the depth of the recesses 62, the solder fine particles protrude from the opening of the recesses 62. When the squeegee is used, the solder fine particles protruding from the opening of the recesses 62 are removed.

Examples of a method of removing excess solder fine particles include a method of spraying compressed air and a method of rubbing the surface 60a of the base material 60 with a non-woven fabric or fiber bundle. These methods are preferable for handling easily deformable solder fine particles because a physical power is weaker than that of the squeegee. In addition, in these methods, solder fine particles protruding from the opening of the recesses 62 can remain in the recess.

The fusing step is a step in which the solder particles 111 accommodated in the recesses 62 are fused, and the solder particles 1 are formed inside the recesses 62. FIG. 6 is a cross-sectional view schematically showing a state in which the solder particles 1 are formed in the recesses 62 of the base material 60. The solder fine particles 111 accommodated in the recesses 62 are melted and coalesced, and spheroidized due to surface tension. In this case, at a part in contact with the bottom 62a of the recesses 62, the molten solder forms a flat portion 11 conforming to the bottom 62a. Thereby, the formed solder particles 1 have a shape having a flat portion 11 on a part of the surface.

FIG. 1 is a diagram of the solder particles 1 when viewed from the side opposite to an opening part of the recesses 62 in FIG. 6.

Examples of a method of melting the solder fine particles 111 accommodated in the recesses 62 include a method of heating the solder fine particles 111 to a melting point of the solder or higher. Due to the influence of an oxide film, even if heated to a temperature equal to or higher than the melting point, the solder fine particles 111 may not melt, may not wet and spread, or may not coalesce. Therefore, when the solder fine particles 111 are exposed to a reducing atmosphere, the oxide film on the surface of the solder fine particles 111 is removed and heating is then performed at a temperature equal to or higher than the melting point of the solder fine particles 111, and the solder fine particles 111 can be melted, wet and spread, and be coalesced. In addition, the solder fine particles 111 are preferably melted under a reducing atmosphere. When the solder fine particles 111 are heated to a temperature equal to or higher than the melting point of the solder fine particles 111 and a reducing atmosphere is created, the oxide film on the surface of the solder fine particles 111 is reduced, and the solder fine particles 111 are efficiently and easily melted, wet and spread, and be coalesced.

The method of creating a reducing atmosphere is not particularly limited as long as the above effects are obtained, and for example, a method using hydrogen gas, hydrogen radicals, formic acid gas, or the like may be used. For example, the solder fine particles 111 can be melted under a reducing atmosphere using a hydrogen reduction furnace, a hydrogen radical reduction furnace, a formic acid reduction furnace, or a conveyor furnace or a consecutive series of such furnaces. In these devices, the furnace may include a heating device, a chamber filled with an inert gas (nitrogen, argon, etc.), a mechanism for evacuating the inside of the chamber and the like, and thereby a reducing gas is more easily controlled. In addition, when the inside of the chamber can be evacuated, after the solder fine particles 111 are melted and coalesced, voids can be removed due to a reduced pressure, and the solder particles 1 having superior connection stability can be obtained.

Profiles such as reducing and dissolving conditions for the solder fine particles 111, the temperature, and adjustment of the atmosphere in the furnace may be appropriately set in consideration of the melting point of the solder fine particles 111, the particle size, the size of the recesses, and the material of the base material 60. For example, the base material 60 in which the solder fine particles 111 are filled into recesses is inserted into a furnace, the furnace is evacuated, a reducing gas is then introduced, the inside of the furnace is filled with a reducing gas, the oxide film on the surface of the solder fine particles 111 is removed, the reducing gas is then removed by evacuation, heating is then performed to a temperature equal to or higher than the melting point of the solder fine particles 111, the solder fine particles are dissolved and coalesced, the solder particles are formed in the recesses 62, the temperature in the furnace is then returned to room temperature after filling with nitrogen gas, and thus the solder particles 1 can be obtained. In addition, for example, the base material 60 in which the solder fine particles 111 are filled into recesses is inserted into a furnace, the furnace is evacuated, a reducing gas is then introduced, the inside of the furnace is filled with a reducing gas, the solder fine particles 111 are heated by a heating heater in the furnace, the oxide film on the surface of the solder fine particles 111 is removed, the reducing gas is then removed by evacuation, heating is then performed to a temperature equal to or higher than the melting point of the solder fine particles 111, the solder fine particles are dissolved and coalesced, the solder particles are formed in the recesses 62, the temperature in the furnace is then returned to room temperature after filling with nitrogen gas, and thus the solder particles 1 can be obtained. When the solder fine particles are heated under a reducing atmosphere, there are advantages that the reducing power increases and the oxide film on the surface of the solder fine particles is easily removed.

In addition, for example, the base material 60 in which the solder fine particles 111 are filled into recesses is inserted into a furnace, the furnace is evacuated, a reducing gas is then introduced, the inside of the furnace is filled with a reducing gas, the base material 60 is heated to a temperature equal to or higher than the melting point of the solder fine particles 111 by a heating heater in the furnace, the oxide film on the surface of the solder fine particles 111 is removed by reduction, and at the same time, the solder fine particles are dissolved and coalesced, the solder particles are formed in the recesses 62, the reducing gas is removed by evacuation, and additionally, the number of voids in the solder particles is reduced, the temperature in the furnace is then returned to room temperature after filling with nitrogen gas, and thus the solder particles 1 can be obtained. In this case, since it is easy to adjust the increase and decrease of the temperature in the furnace once, there is an advantage that processing can be performed in a short time.

A step in which the inside of the furnace is made into a reducing atmosphere again and the oxide film on the surface that has not been completely removed is removed after the solder particles are formed in the recesses 62 may be additionally performed, and it is thus possible to reduce the amount of residue such as remaining unfused solder fine particles and a part of the unfused remaining oxide film.

When an atmospheric pressure conveyor furnace is used, the base material 60 in which the solder fine particles 111 are filled into recesses is placed on a transport conveyor and is caused to pass through a plurality of zones consecutively, and thus the solder particles 1 can be obtained. For example, the base material 60 in which the solder fine particles 111 are filled into recesses is placed on a conveyor set at a certain speed and caused to pass through a zone filled with an inert gas such as nitrogen or argon with a temperature lower than the melting point of the solder fine particles 111 and subsequently pass through a zone in which a reducing gas such as formic acid gas with a temperature lower than the melting point of the solder fine particles 111 is provided, the oxide film on the surface of the solder fine particles 111 is removed, and subsequently the material is caused to pass through a zone filled with an inert gas such as nitrogen and argon with a temperature equal to or higher than the melting point of the solder fine particles 111, the solder fine particles 111 are melted and coalesced, and subsequently the material is caused to pass through a cooling zone filled with an inert gas such as nitrogen and argon, and thus the solder particles 1 can be obtained. For example, the base material 60 in which the solder fine particles 111 are filled into recesses is placed on a conveyor set at a certain speed and caused to pass through a zone filled with an inert gas such as nitrogen and argon with a temperature equal to or higher than the melting point of the solder fine particles 111, subsequently pass through a zone in which a reducing gas such as formic acid gas with a temperature equal to or higher than the melting point of the solder fine particles 111 is provided, the oxide film on the surface of the solder fine particles 111 is removed, and melting and coalescing are performed, subsequently the material is caused to pass through a cooling zone filled with an inert gas such as nitrogen and argon, and thus the solder particles 1 can be obtained. Since the above conveyor furnace can perform processing at atmospheric pressure, it is possible to continuously process a film-like material in a roll to roll method. For example, a continuous roll product of the base material 60 in which the solder fine particles 111 are filled into recesses is produced, a roller unwinding machine is installed on the inlet side of the conveyor furnace, a roller winding machine is installed on the exit side of the conveyor furnace, the base material 60 is transported at a certain speed and caused to pass through zones in the conveyor furnace, and thus the solder fine particles 111 filled into the recesses can be fused.

The formed solder particles 1 that are accommodated in the recesses 62 of the base material 60 may be transported or stored, and the formed solder particles 1 may be removed from the recesses 62 and collected.

In addition, a resin material is disposed on the surface 60a of the base material 60, and the solder particles 1 in the recesses 62 may be transferred to the resin material. In this case, when the recesses 62 are regularly arranged, the solder particles 1 can be regularly arranged on the resin material. In addition, in this case, the flat portion of the arranged solder particles 1 can be maintained in one direction. Therefore, the flat portions are effectively used during electrode connection, and as described above, it is easy to obtain advantages that a large contact area between the solder particles and the electrode is secured, and displacement of the solder particles is minimized.

According to the production method of the present embodiment, it is possible to form solder particles having a uniform size regardless of the material and shape of the solder fine particles. For example, indium-based solder can be precipitated by plating, but is unlikely to be precipitated in the form of particles and is hard to handle because it is soft. However, in the production method of the present embodiment, it is possible to easily produce indium-based solder particles having a uniform particle diameter using indium-based solder fine particles as a raw material. In addition, since the formed solder particles 1 that are accommodated in the recesses 62 of the base material 60 can be handled, the solder particles can be transported and stored without being deformed. In addition, since the formed solder particles 1 are simply accommodated in the recesses 62 of the base material 60, they can be easily removed, and the solder particles can be collected and subjected to a surface treatment and the like without being deformed.

In addition, the solder fine particles 111 may have a large variation in the particle size distribution or may have a distorted shape but can be used as a raw material in the production method of the present embodiment as long as they can be accommodated in the recesses 62.

In addition, in the production method of the present embodiment, in the base material 60, the shape of the recesses 62 can be freely designed according to a lithography method, an imprint method, an electron beam processing method, a radiation processing method, a machining method, or the like. Since the size of the solder particles 1 depends on the amount of the solder fine particles 111 accommodated in the recesses 62, in the production method of the present embodiment, the size of the solder particles 1 can be freely designed according to designing of the recesses 62.

While preferred embodiments of the present invention have been described above, the present invention is not limited to the above embodiments.

EXAMPLES

The present invention will be described below in more detail with reference to examples, but the present invention is not limited to these examples.

<Production of Solder Particles>

Example 1

(Step a1: Classification of Solder Fine Particles)

100 g of Sn—Bi solder fine particles (Type 8 commercially available from 5N Plus, a melting point of 139° C.), were immersed in distilled water and ultrasonically dispersed and then left, and the solder fine particles suspended in the supernatant were collected. This operation was repeated, and 10 g of the solder fine particles were collected. The average particle diameter of the obtained solder fine particles was 1.0 μm, and the C.V. value was 42%.

(Step b1: Disposition in Base Material)

A base material (polyimide film, a thickness of 100 μm) having a plurality of recesses with an opening diameter of 1.2 μmφ, a bottom diameter of 1.0 μmφ, and a depth of 1.0 μm (when the opening part was viewed from the top, the bottom diameter of 1.0 μmφ corresponded to the opening diameter of 1.2 μmφ at the center) was prepared. The plurality of recesses were regularly arranged at intervals of 1.0 μm. The solder fine particles (with an average particle diameter of 1.0 μm and a C.V. value of 42%) obtained in Step a were disposed in the recesses of the base material. Here, the surface side on which the recesses of the base material were formed was rubbed with a fine adhesive roller, excess solder fine particles were removed, and a base material in which the solder fine particles were disposed only in the recesses was obtained.

(Step c1: Formation of Solder Particles)

The base material in which the solder fine particles were disposed in the recesses in Step b1 was put into a hydrogen reduction furnace and the furnace was evacuated, hydrogen gas was then introduced into the furnace, and the inside of the furnace was filled with hydrogen. Then, the temperature in the furnace was kept at 280° C. for 20 minutes, the furnace was then evacuated again, nitrogen was introduced to return to atmospheric pressure, the temperature in the furnace was then lowered to room temperature, and thereby solder particles were formed.

Here, when the base material that had undergone Step c1 was tapped from the back side of the recesses, the solder particles were collected from the recesses. The obtained solder particles were observed according to the following method. The obtained solder particles were placed on a conductive tape fixed to a surface of a pedestal for scanning electron microscope (SEM) observation, the pedestal for SEM observation was tapped on a stainless steel plate with a thickness of 5 mm, and the solder particles spread evenly on the conductive tape. Then, compressed nitrogen gas was sprayed onto the surface of the conductive tape and the solder particles were fixed as a single layer on the conductive tape. The observation results are shown in FIG. 7. FIG. 7 shows an SEM image of a solder particle obtained in Example 1. As shown in FIG. 7, the obtained solder particles had a shape in which a flat portion was formed in a part of surface of the sphere. Here, the solder particles obtained in the other examples also had the same shape.

Examples 2 to 12

Solder particles were produced in the same manner as in Example 1 except that the size of the recess was changed as shown in Table 1.

Example 13

Solder particles were produced, collected and evaluated in the same manner as in Example 1 except that the following Step c2 was performed in place of Step c1. The results are shown in Table 2.

(Step c2: Formation of Solder Particles)

The base material in which the solder fine particles were disposed in the recesses in Step b1 was put into a hydrogen radical reduction furnace (plasma reflow device commercially available from Shinko Seiki Co., Ltd.), the furnace was evacuated, hydrogen gas was introduced into the furnace, and the inside of the furnace was filled with hydrogen gas. Then, the temperature in the furnace was adjusted to 120° C. and hydrogen radicals were emitted for 5 minutes. Then, hydrogen gas in the furnace was removed by evacuation, heating was performed to 170° C., nitrogen was then introduced into the furnace to return to atmospheric pressure, the temperature in the furnace was then lowered to room temperature, and thereby solder particles were formed.

Examples 14 to 24

Solder particles were produced, collected and evaluated in the same manner as in Example 13 except that the size of the recess was changed as shown in Table 1. The results are shown in Table 2.

Example 25

Solder particles were produced, collected and evaluated in the same manner as in Example 1 except that the following Step c2 was performed in place of Step c1. The results are shown in Table 2.

(Step c2: Formation of Solder Particles)

The base material in which the solder fine particles were disposed in the recesses in Step b1 was put into a hydrogen radical reduction furnace (plasma reflow device commercially available from Shinko Seiki Co., Ltd.), the furnace was evacuated, hydrogen gas was introduced into the furnace, and the inside of the furnace was filled with hydrogen gas. Then, the temperature in the furnace was adjusted to 120° C. and hydrogen radicals were emitted for 5 minutes. Then, hydrogen gas in the furnace was removed by evacuation, heating was performed to 145° C., nitrogen was then introduced into the furnace to return to atmospheric pressure, the temperature in the furnace was then lowered to room temperature, and thereby solder particles were formed.

Examples 26 to 36

Solder particles were produced, collected and evaluated in the same manner as in Example 25 except that the size of the recess was changed as shown in Table 1. The results are shown in Table 2.

<Production of Anisotropic Conductive Film>

Production Example 1

(Step d1: Filling of Flux into Recesses)

10 g of adipic acid was dissolved in 200 g of toluene to prepare a coating solution, and this solution was applied to the base material (transfer mold) in which the solder particles were to be disposed in the recesses in Step c1. Then, the excess coating solution was removed using a squeegee, and the inside of the recesses was filled with the coating solution. This was put into an explosion preventive dryer at 80° C. for 1 minute, toluene was vaporized, and adipic acid as a flux component was thus filled into the recesses.

(Step e1: Production of Adhesive Film)

100 g of a phenoxy resin (product name "PKHC" commercially available from Union Carbide Corporation) and 75 g of an acrylic rubber (a copolymer containing 40 parts by mass of butyl acrylate, 30 parts by mass of ethyl acrylate, 30 parts by mass of acrylonitrile, and 3 parts by mass of glycidyl methacrylate, molecular weight: 850,000) were dissolved in 400 g of ethyl acetate to obtain a solution. 300 g of a liquid epoxy resin containing a microcapsule type latent curing agent (an epoxy equivalent of 185, product name "Novacure HX-3941" commercially available from Asahi Kasei Corporation) was added to the solution, and the mixture was stirred to obtain an adhesive solution. The obtained adhesive solution was applied to a separator (silicone-treated polyethylene terephthalate film, a thickness of 40 μm) using a roll coater, and heated at 90° C. for 10 minutes and dried, and adhesive films (insulating resin films) having a thickness of 4 μm, 6 μm, 8 μm, 12 μm and 20 μm were prepared on the separator.

(Step f1: Transfer of Solder Particles)

The adhesive film formed on the separator and the base material (transfer mold) in which the flux-coated solder particles obtained in Step d1 were disposed were arranged to face each other and the solder particles were transferred to the adhesive film.

(Step g1: Production of Anisotropic Conductive Film)

The adhesive film produced in the same method as in Step e1 was brought into contact with a transfer surface of the adhesive film obtained in Step f1 and heated and pressurized at 50° C. and 0.1 MPa (1 kgf/cm$^2$), and an anisotropic conductive film in which the solder particles were disposed in layers in a cross-sectional view of the film, and a flat portion of the solder particles faced only one of the main surfaces of the film was obtained. Here, 4 μm was superimposed for a film with a thickness of 4 μm, and similarly, 6 μm was superimposed for a film with a thickness of 6 μm, 8 μm was superimposed for a film with a thickness of 8 μm, 12 μm was superimposed for a film with a thickness of 12 μm, and 20 μm was superimposed for a film with a thickness of 20 μm, and anisotropic conductive films having a thickness of 8 μm, 12 μm, 16 μm, 24 μm and 40 μm were produced.

[Evaluation of Solder Particles]

The adhesive film obtained in Step f1 was cut to 10 cm×10 cm, Pt sputtering was performed on a surface on which the solder particles were disposed, and observation was then performed using an SEM. 300 solder particles were observed, and the average diameter B (average particle diameter) of the solder particles, the average diameter A of the flat portion, the C.V. value, the roundness, and A/B and Y/X were calculated. The results are shown in Table 2.

Roundness: a ratio r/R of radii of two concentric circles (a radius r of a minimum circumscribed circle, and a radius R of a maximum inscribed circle) of solder particles A/B: a ratio of the diameter A of the flat portion to the diameter B of solder particles Y/X: a ratio of Y to X when distances between opposite sides were set as X and Y (where Y<X), and a quadrangle circumscribing a projected image of a solder particle was created by two pairs of parallel lines <Production of Connection Structure>

(Step h1: Preparation of Chip with Copper Bumps)

Five types of chips with copper bumps (1.7 mm×1.7 mm, thickness: 0.5 mm) shown below were prepared.

Chip C1 . . . area 30 μm×30 μm, space 30 μm, height: 10 μm, number of bumps 362

Chip C2 . . . area 15 μm×15 μm, space 10 μm, height: 10 μm, number of bumps 362

Chip C3 . . . area 10 μm×10 μm, space 10 μm, height: 7 μm, number of bumps 362

Chip C4 . . . area 5 μm×5 μm, space 6 μm, height: 5 μm, number of bumps 362

Chip C5 . . . area 3 μm×3 μm, space 3 μm, height: 5 μm, number of bumps 362

(Step i1: Preparation of Substrate with Copper Bumps)

Five types of substrates with copper bumps (thickness: 0.7 mm) shown below were prepared.

Substrate D1 . . . area 30 μm×30 μm, space 30 μm, height: 10 μm, number of bumps 362

Substrate D2 . . . area 15 μm×15 μm, space 10 μm, height: 10 μm, number of bumps 362

Substrate D3 . . . area 10 μm×10 μm, space 10 μm, height: 7 μm, number of bumps 362

Substrate D4 . . . area 5 μm×5 μm, space 6 μm, height: 5 μm, number of bumps 362

Substrate D5 . . . area 3 μm×3 μm, space 3 μm, height: 5 μm, number of bumps 362

(Step j1: Connection Between Chip with Copper Bumps and Substrate with Copper Bumps)

Next, using the anisotropic conductive film produced in Step g1, a chip with copper bumps (1.7 mm×1.7 mm, thickness: 0.5 mm) and a substrate with copper bumps (thickness: 0.7 mm) were connected according to the following procedures i) to iii) to obtain a connection structure.

i) A separator (silicone-treated polyethylene terephthalate film, a thickness of 40 μm) on one surface of the anisotropic conductive film (2 mm×19 mm) was peeled off, and the anisotropic conductive film and the substrate with copper bumps were brought into contact with each other and bonded at 80° C. and 0.98 MPa (10 kgf/cm$^2$).

ii) A separator on the other surface was peeled off, and the chip with copper bumps was bonded while the bumps of the chip with copper bumps and the bumps of the substrate with copper bumps were aligned. Here, the flat portion of the solder particles faced the side of the substrate with copper bumps.

iii) Heating and pressurizing were performed from above the chip under conditions of 180° C., 40 gf/bump, and 30 seconds, and thus connection was performed. A total of seven types of connection structures according to (1) to (7) were produced by combining the following (1) to (7) "chip/anisotropic conductive film/substrate"

(1) Chip C1/conductive film with a thickness of 40 μm/substrate D1

(2) Chip C1/conductive film with a thickness of 24 μm/substrate D1

(3) Chip C1/conductive film with a thickness of 16 μm/substrate D1

(4) Chip C2/conductive film with a thickness of 16 μm/substrate D2

(5) Chip C3/conductive film with a thickness of 12 μm/substrate D3

(6) Chip C4/conductive film with a thickness of 8 μm/substrate D4

(7) Chip C5/conductive film with a thickness of 8 μm/substrate D5

Production Examples 2 to 36

An anisotropic conductive film and a connection structure were produced in the same method as in Production Example 1 except that the base material (transfer mold) in which solder particles were disposed in recesses obtained in Examples 2 to 36 was used.

Comparative Production Example 1

A solder particles-containing anisotropic conductive paste containing the following components in the following parts by mass was produced.
Polymer: 12 parts by mass
Thermosetting compound: 29 parts by mass
High dielectric constant curing agent: 20 parts by mass
Thermosetting agent: 11.5 parts by mass
Flux-coated solder particles: 36 parts by mass (2 parts by mass of flux, 34 parts by mass of solder particles)

The polymer was prepared as follows.

Synthesis of a reaction product (polymer A) of bisphenol F, 1,6-hexanediol diglycidyl ether, and a bisphenol F type epoxy resin:

72 parts by mass of bisphenol F (containing 4,4'-methylene bisphenol, 2,4'-methylene bisphenol, and 2,2'-methylene bisphenol at a mass ratio of 2:3:1), 70 parts by mass of 1,6-hexanediol diglycidyl ether, and 30 parts by mass of a bisphenol F type epoxy resin ("EPICLON EXA-830CRP" commercially available from DIC) were put into a three-neck flask and dissolved at 150° C. under a nitrogen flow. Then, 0.1 parts by mass of tetra n-butyl sulfonium bromide as an addition reaction catalyst for hydroxy groups and epoxy groups was added, and an addition polymerization reaction was performed at 150° C. for 6 hours under a nitrogen flow to obtain a reaction product (polymer).

Regarding the thermosetting compound, a resorcinol type epoxy compound ("EX-201" commercially available from Nagase ChemteX Corporation) was used.

Regarding the high dielectric constant curing agent, pentaerythritol tetrakis(3-mercaptobutyrate) was used.

Regarding the thermosetting agent, "Karenz MT PE1" (commercially available from Showa Denko K.K.) was used.

The flux-coated solder particles were prepared as follows. 200 g of SnBi solder particles ("ST-3" commercially available from Mitsu Mining & Smelting Co., Ltd.), 40 g of adipic acid, and 70 g of acetone were weighed out in a three-neck flask, and 0.3 g of dibutyl tin oxide as a dehydration condensation catalyst for hydroxy groups on the surface of solder particle bodies and carboxylic groups of adipic acid was then added thereto and reacted at 60° C. for 4 hours. Then, the solder particles were collected by filtration. The collected solder particles, 50 g of adipic acid, 200 g of toluene, and 0.3 g of para-toluene sulfonic acid were weighed out in a three-neck flask, and reacted at 120° C. for 3 hours while evacuating and refluxing. In this case, the reaction was performed while removing water generated by dehydration condensation using a Dean-Stark extraction device. Then, the solder particles were collected by filtration, washed with hexane and dried. Then, the obtained solder particles were crushed with a ball mill and a sieve was then selected so that a predetermined C.V. value was obtained. The average particle diameter of the obtained SnBi solder particles (flux-coated solder particles) was 4 μm, and the C.V. value was 31%.

Using the solder particles-containing anisotropic conductive paste, a chip with copper bumps and a substrate with copper bumps were connected in the same manner as in Production Example 1 to produce a connection structure. The solder particles-containing anisotropic conductive paste was applied onto the substrate and the chip was additionally placed thereon. The bumps of the chip with copper bumps and the bumps of the substrate with copper bumps were aligned, heating and pressurizing were performed from above the chip under conditions of 180° C., 4 gf/bump, and 30 seconds, and thus connection was performed.

Comparative Production Example 2

A solder particles-containing anisotropic conductive paste was produced in the same manner as in Comparative Production Example 1 except that 200 g of SnBi solder particles ("Type-4" commercially available from Mitsu Mining & Smelting Co., Ltd.) were used in place of 200 g of SnBi solder particles ("ST-3" commercially available from Mitsu Mining & Smelting Co., Ltd). Here, SnBi solder particles having an average particle diameter of 26 μm and a C.V. value of 25% were used. In addition, a connection structure was produced in the same manner as in Comparative Production Example 1 using the obtained solder particles-containing anisotropic conductive paste.

<Evaluation of Connection Structure>

A conduction resistance test and an insulation resistance test were performed on a part of the obtained connection structure as follows.

(Conduction Resistance Test-Moisture Absorption and Heat Resistance Test)

Regarding the conduction resistance between the chip with copper bumps (bumps)/the substrate with copper bumps (bumps), the initial value of the conduction resistance and the value after the moisture absorption and heat resistance test (being left under conditions of a temperature of 85° C. and a humidity of 85% for 100, 500, and 1,000 hours) were measured for 20 samples, and the average value thereof was calculated.

The conduction resistance was evaluated from the obtained average value according to the following criteria. The results are shown in Table 3. Here, when the following criterion A or B was satisfied after the moisture absorption and heat resistance test was performed for 1,000 hours, the conduction resistance was evaluated as favorable.
A: Average value of the conduction resistance was less than 2 Ω
B: Average value of the conduction resistance was 2Ω or more and less than 5 Ω
C: Average value of the conduction resistance was 5Ω or more and less than 10 Ω
D: Average value of the conduction resistance was 10Ω or more and less than 20 Ω
E: Average value of the conduction resistance was 20Ω or more (Conduction Resistance Test-High Temperature Endurance Test)

Regarding the conduction resistance between the chip with copper bumps (bumps)/the substrate with copper bumps (bumps), the samples were measured before being left at a high temperature and after the high temperature endurance test (being left under conditions of a temperature of 100° C. for 100 hours, 500 hours, and 1,000 hours). Here, after being left at a high temperature, a drop impact was applied and the conduction resistance of the sample after the drop impact was measured. For the drop impact, the connection structure was screwed and fixed to a metal plate and dropped from a height of 50 cm. After being dropped, the DC resistance value was measured at solder bonding parts (4 points) on a chip corner in which the impact was greatest, and evaluation was performed assuming that breakage had occurred when the measured value increased to 5 or more times the initial resistance. Here, the measurement was performed at 4 points for 20 samples, for a total of 80 points. The results are shown in Table 4. When the following criterion A or B was satisfied after 20 drops, the solder connection reliability was evaluated as favorable.

A: After 20 drops, no solder connecting parts having a value increased to 5 or more times the initial resistance was observed at any of the 80 points.

B: After 20 drops, a solder connecting part having a value increased to 5 or more times the initial resistance was observed at 1 point or more and 5 points or less.

C: After 20 drops, a solder connecting part having a value increased to 5 or more times the initial resistance was observed at 6 points or more and 20 points or less.

D: After 20 drops, a solder connecting part having a value increased to 5 or more times the initial resistance was observed at 21 points or more.

(Insulation Resistance Test)

Regarding the insulation resistance between chip electrodes, the initial value of the insulation resistance and the value after the migration test (being left under conditions of a temperature of 60° C., a humidity of 90%, and 20 V application for 100 hours, 500 hours, 1,000 hours) were measured for 20 samples, and a proportion of samples having an insulation resistance value of $10^9 \Omega$ or more with respect to all 20 samples was calculated. The insulation resistance was evaluated from the obtained proportion according to the following criteria. The results are shown in Table 5. Here, when the following criterion A or B was satisfied after the moisture absorption and heat resistance test was performed for 1,000 hours, the insulation resistance was evaluated as favorable.

A: Proportion with an insulation resistance value of $10^9 \Omega$ or more was 100%

B: Proportion with an insulation resistance value of $10^9 \Omega$ or more was 90% or more and less than 100%

C: Proportion with an insulation resistance value of $10^9 \Omega$ or more was 80% or more and less than 90%

D: Proportion with an insulation resistance value of $10^9 \Omega$ or more was 50% or more and less than 80%

E: Proportion with an insulation resistance value of $10^9 \Omega$ or more was less than 50%

TABLE 1

|  |  | Example 1 | Example 2 | Example 3 | Example 4 | Example 5 | Example 6 |
|---|---|---|---|---|---|---|---|
| Opening diameter | μm | 1.2 | 1.7 | 2.3 | 3.3 | 4.3 | 5.3 |
| Bottom diameter | μm | 1 | 1.5 | 2 | 3 | 4 | 5 |
| Depth | μm | 1 | 1.5 | 2 | 3 | 4 | 5 |
| Interval | μm | 1 | 1.5 | 2 | 3 | 4 | 5 |

|  |  | Example 7 | Example 8 | Example 9 | Example 10 | Example 11 | Example 12 |
|---|---|---|---|---|---|---|---|
| Opening diameter | μm | 6.3 | 11 | 17 | 27 | 34 | 41 |
| Bottom diameter | μm | 6 | 10 | 15 | 26 | 33 | 40 |
| Depth | μm | 6 | 10 | 15 | 15 | 15 | 15 |
| Interval | μm | 6 | 10 | 15 | 20 | 25 | 30 |

TABLE 2

|  |  | Example 1 | Example 2 | Example 3 | Example 4 | Example 5 | Example 6 |
|---|---|---|---|---|---|---|---|
| Average diameter B (Average particle diameter) | μm | 1 | 1.5 | 2 | 3 | 4 | 5 |
| Diameter A of flat portion | μm | 0.2 | 0.3 | 0.4 | 0.5 | 0.6 | 0.7 |
| C.V. value | % | 10 | 10 | 9.6 | 9.5 | 7.9 | 7.8 |
| Roundness |  | 0.93 | 0.93 | 0.93 | 0.93 | 0.93 | 0.93 |
| A/B | — | 0.20 | 0.20 | 0.20 | 0.17 | 0.15 | 0.14 |
| Y/X | — | 0.94 | 0.92 | 0.92 | 0.93 | 0.93 | 0.91 |

|  |  | Example 7 | Example 8 | Example 9 | Example 10 | Example 11 | Example 12 |
|---|---|---|---|---|---|---|---|
| Average diameter B (Average particle diameter) | μm | 6 | 10 | 15 | 20 | 25 | 30 |
| Diameter A of flat portion | μm | 0.8 | 1.4 | 2.0 | 3.6 | 4.5 | 5.1 |
| C.V. value | % | 6.6 | 5.2 | 4.4 | 4.2 | 3.9 | 3.3 |
| Roundness |  | 0.93 | 0.93 | 0.93 | 0.93 | 0.93 | 0.93 |
| A/B | — | 0.13 | 0.14 | 0.13 | 0.18 | 0.18 | 0.17 |
| Y/X | — | 0.91 | 0.92 | 0.90 | 0.87 | 0.84 | 0.82 |

|  |  | Example 13 | Example 14 | Example 15 | Example 16 | Example 17 | Example 18 |
|---|---|---|---|---|---|---|---|
| Average diameter B (Average particle diameter) | μm | 1 | 1.5 | 2 | 3 | 4 | 5 |
| Diameter A of flat portion | μm | 0.3 | 0.6 | 0.9 | 1.2 | 1.4 | 2.2 |
| C.V. value | % | 9.3 | 9.1 | 9.0 | 8.8 | 7.9 | 7.6 |
| Roundness |  | 0.93 | 0.93 | 0.93 | 0.93 | 0.93 | 0.93 |
| A/B | — | 0.30 | 0.40 | 0.45 | 0.40 | 0.35 | 0.44 |
| Y/X | — | 0.94 | 0.92 | 0.92 | 0.93 | 0.93 | 0.91 |

TABLE 2-continued

|  |  | Example 19 | Example 20 | Example 21 | Example 22 | Example 23 | Example 24 |
|---|---|---|---|---|---|---|---|
| Average diameter B (Average particle diameter) | μm | 6 | 10 | 15 | 20 | 25 | 30 |
| Diameter A of flat portion | μm | 3.1 | 5.1 | 6.0 | 7.2 | 8.3 | 9.3 |
| C.V. value | % | 6.5 | 5.0 | 4.4 | 4.2 | 3.9 | 3.2 |
| Roundness |  | 0.93 | 0.93 | 0.93 | 0.93 | 0.93 | 0.93 |
| A/B | — | 0.52 | 0.51 | 0.40 | 0.36 | 0.33 | 0.31 |
| Y/X | — | 0.91 | 0.92 | 0.90 | 0.87 | 0.84 | 0.82 |

|  |  | Example 25 | Example 26 | Example 27 | Example 28 | Example 29 | Example 30 |
|---|---|---|---|---|---|---|---|
| Average diameter B (Average particle diameter) | μm | 1 | 1.5 | 2 | 3 | 4 | 5 |
| Diameter A of flat portion | μm | 0.5 | 0.9 | 1.1 | 1.4 | 2.1 | 2.7 |
| C.V. value | % | 9.3 | 9.1 | 9.0 | 9.0 | 9.2 | 10.0 |
| Roundness |  | 0.91 | 0.91 | 0.90 | 0.91 | 0.91 | 0.90 |
| A/B | — | 0.45 | 0.60 | 0.55 | 0.47 | 0.53 | 0.54 |
| Y/X | — | 0.89 | 0.89 | 0.89 | 0.89 | 0.88 | 0.87 |

|  |  | Example 31 | Example 32 | Example 33 | Example 34 | Example 35 | Example 36 |
|---|---|---|---|---|---|---|---|
| Average diameter B (Average particle diameter) | μm | 6 | 10 | 15 | 20 | 25 | 30 |
| Diameter A of flat portion | μm | 3.2 | 4.9 | 6.0 | 14.0 | 18.3 | 22.3 |
| C.V. value | % | 11.0 | 14.2 | 15.1 | 16.2 | 18.1 | 19.2 |
| Roundness |  | 0.89 | 0.88 | 0.86 | 0.82 | 0.82 | 0.79 |
| A/B | — | 0.53 | 0.49 | 0.40 | 0.70 | 0.73 | 0.74 |
| Y/X | — | 0.85 | 0.77 | 0.75 | 0.73 | 0.72 | 0.72 |

TABLE 3

|  |  |  |  | Production Example 1 Example 1 | Production Example 2 Example 2 | Production Example 3 Example 3 | Production Example 4 Example 4 | Production Example 5 Example 5 | Production Example 6 Example 6 | Production Example 7 Example 7 | Production Example 8 Example 8 |
|---|---|---|---|---|---|---|---|---|---|---|---|
| Conduction resistance | Moisture absorption and heat resistance test | (1) | Initial |  |  |  |  |  |  |  |  |
|  |  |  | After 100 hours |  |  |  |  |  |  |  |  |
|  |  |  | After 500 hours |  |  |  |  |  |  |  |  |
|  |  |  | After 1,000 hours |  |  |  |  |  |  |  |  |
|  |  | (2) | Initial |  |  |  |  |  |  |  | A |
|  |  |  | After 100 hours |  |  |  |  |  |  |  | B |
|  |  |  | After 500 hours |  |  |  |  |  |  |  | B |
|  |  |  | After 1,000 hours |  |  |  |  |  |  |  | B |
|  |  | (3) | Initial |  |  | A | A | A | A | A | A |
|  |  |  | After 100 hours |  |  | B | B | A | A | A | A |
|  |  |  | After 500 hours |  |  | B | B | A | A | A | A |
|  |  |  | After 1,000 hours |  |  | B | B | A | A | A | A |
|  |  | (4) | Initial |  |  | A | A | A | A | A | A |
|  |  |  | After 100 hours |  |  | B | A | A | A | A | A |
|  |  |  | After 500 hours |  |  | B | A | A | A | A | A |
|  |  |  | After 1,000 hours |  |  | B | A | A | A | A | A |
|  |  | (5) | Initial | A | A | A | A | A | A | A | A |
|  |  |  | After 100 hours | B | B | A | A | A | A | A | A |
|  |  |  | After 500 hours | B | B | A | A | A | A | A | A |
|  |  |  | After 1,000 hours | B | B | A | A | A | A | A | A |
|  |  | (6) | Initial | B | A | A | A | A | A | A |  |
|  |  |  | After 100 hours | B | B | A | A | A | A | A |  |
|  |  |  | After 500 hours | B | B | A | A | A | A | A |  |
|  |  |  | After 1,000 hours | B | B | A | A | A | A | A |  |
|  |  | (7) | Initial | B | A | A | A | A | A | A |  |
|  |  |  | After 100 hours | B | A | A | A | A | A | A |  |
|  |  |  | After 500 hours | B | A | A | A | A | A | A |  |
|  |  |  | After 1,000 hours | B | A | A | A | A | A | A |  |

TABLE 3-continued

|  |  |  |  | Production Example 9 Example 9 | Production Example 10 Example 10 | Production Example 11 Example 11 | Production Example 12 Example 12 | Comparative Production Example 1 | Comparative Production Example 2 |
|---|---|---|---|---|---|---|---|---|---|
| Conduction resistance | Moisture absorption and heat resistance test | (1) | Initial |  | A | A | A |  | A |
|  |  |  | After 100 hours |  | A | A | A |  | A |
|  |  |  | After 500 hours |  | A | A | A |  | A |
|  |  |  | After 1,000 hours |  | A | A | A |  | A |
|  |  | (2) | Initial | A | A | A |  |  | A |
|  |  |  | After 100 hours | A | A | A |  |  | A |
|  |  |  | After 500 hours | A | A | A |  |  | A |
|  |  |  | After 1,000 hours | A | A | A |  |  | A |
|  |  | (3) | Initial | A |  |  |  | A |  |
|  |  |  | After 100 hours | A |  |  |  | B |  |
|  |  |  | After 500 hours | A |  |  |  | B |  |
|  |  |  | After 1,000 hours | A |  |  |  | B |  |
|  |  | (4) | Initial | A |  |  |  | A |  |
|  |  |  | After 100 hours | A |  |  |  | B |  |
|  |  |  | After 500 hours | A |  |  |  | B |  |
|  |  |  | After 1,000 hours | A |  |  |  | B |  |
|  |  | (5) | Initial |  |  |  |  | A |  |
|  |  |  | After 100 hours |  |  |  |  | B |  |
|  |  |  | After 500 hours |  |  |  |  | B |  |
|  |  |  | After 1,000 hours |  |  |  |  | C |  |
|  |  | (6) | Initial |  |  |  |  | A |  |
|  |  |  | After 100 hours |  |  |  |  | B |  |
|  |  |  | After 500 hours |  |  |  |  | C |  |
|  |  |  | After 1,000 hours |  |  |  |  | C |  |
|  |  | (7) | Initial |  |  |  |  | C |  |
|  |  |  | After 100 hours |  |  |  |  | C |  |
|  |  |  | After 500 hours |  |  |  |  | D |  |
|  |  |  | After 1,000 hours |  |  |  |  | E |  |

TABLE 4

|  |  |  |  | Production Example 1 Example 1 | Production Example 2 Example 2 | Production Example 3 Example 3 | Production Example 4 Example 4 | Production Example 5 Example 5 | Production Example 6 Example 6 | Production Example 7 Example 7 | Production Example 8 Example 8 |
|---|---|---|---|---|---|---|---|---|---|---|---|
| Conduction resistance | High temperature endurance test | (1) | Initial |  |  |  |  |  |  |  |  |
|  |  |  | After 100 hours |  |  |  |  |  |  |  |  |
|  |  |  | After 500 hours |  |  |  |  |  |  |  |  |
|  |  |  | After 1,000 hours |  |  |  |  |  |  |  |  |
|  |  | (3) | Initial |  |  | A | A | A | A | A | A |
|  |  |  | After 100 hours |  |  | B | A | A | A | A | A |
|  |  |  | After 500 hours |  |  | B | A | A | A | A | A |
|  |  |  | After 1,000 hours |  |  | B | A | A | A | A | A |
|  |  | (6) | Initial | A | A | A | A | A | A | A |  |
|  |  |  | After 100 hours | B | A | A | A | A | A | A |  |
|  |  |  | After 500 hours | B | A | A | A | A | A | A |  |
|  |  |  | After 1,000 hours | B | A | A | A | A | A | A |  |

|  |  |  |  | Production Example 9 Example 9 | Production Example 10 Example 10 | Production Example 11 Example 11 | Production Example 12 Example 12 | Comparative Production Example 1 | Comparative Production Example 2 |
|---|---|---|---|---|---|---|---|---|---|
| Conduction resistance | High temperature endurance test | (1) | Initial |  | A | A | A |  | A |
|  |  |  | After 100 hours |  | A | A | A |  | A |
|  |  |  | After 500 hours |  | A | A | A |  | A |
|  |  |  | After 1,000 hours |  | A | A | A |  | A |
|  |  | (3) | Initial | A |  |  |  | A |  |
|  |  |  | After 100 hours | A |  |  |  | B |  |
|  |  |  | After 500 hours | A |  |  |  | B |  |
|  |  |  | After 1,000 hours | A |  |  |  | B |  |

TABLE 4-continued

| | | |
|---|---|---|
| (6) | Initial | B |
| | After 100 hours | C |
| | After 500 hours | D |
| | After 1,000 hours | D |

TABLE 5

| | | | | Production Example 1 Example 1 | Production Example 2 Example 2 | Production Example 3 Example 3 | Production Example 4 Example 4 | Production Example 5 Example 5 | Production Example 6 Example 6 | Production Example 7 Example 7 | Production Example 8 Example 8 |
|---|---|---|---|---|---|---|---|---|---|---|---|
| | | Connection structure | Solder particles | | | | | | | | |
| Insulation resistance | Moisture absorption and heat resistance test | (1) | Initial | | | | | | | | |
| | | | After 100 hours | | | | | | | | |
| | | | After 500 hours | | | | | | | | |
| | | | After 1,000 hours | | | | | | | | |
| | | (2) | Initial | | | | | | | | A |
| | | | After 100 hours | | | | | | | | A |
| | | | After 500 hours | | | | | | | | A |
| | | | After 1,000 hours | | | | | | | | A |
| | | (3) | Initial | | | A | A | A | A | A | A |
| | | | After 100 hours | | | A | A | A | A | A | A |
| | | | After 500 hours | | | A | A | A | A | A | A |
| | | | After 1,000 hours | | | A | A | A | A | A | A |
| | | (4) | Initial | | | A | A | A | A | A | A |
| | | | After 100 hours | | | A | A | A | A | A | A |
| | | | After 500 hours | | | A | A | A | A | A | A |
| | | | After 1,000 hours | | | A | A | A | A | A | A |
| | | (5) | Initial | A | A | A | A | A | A | A | A |
| | | | After 100 hours | A | A | A | A | A | A | A | B |
| | | | After 500 hours | A | A | A | A | A | A | A | B |
| | | | After 1,000 hours | A | A | A | A | A | A | A | B |
| | | (6) | Initial | A | A | A | A | A | A | A | |
| | | | After 100 hours | A | A | A | A | A | B | | |
| | | | After 500 hours | A | A | A | A | A | B | | |
| | | | After 1,000 hours | A | A | A | A | A | B | | |
| | | (7) | Initial | A | A | A | A | | | | |
| | | | After 100 hours | A | A | A | B | | | | |
| | | | After 500 hours | A | A | A | B | | | | |
| | | | After 1,000 hours | A | A | A | B | | | | |

| | | | | Production Example 9 Example 9 | Production Example 10 Example 10 | Production Example 11 Example 11 | Production Example 12 Example 12 | Comparative Production Example 1 | Comparative Production Example 2 |
|---|---|---|---|---|---|---|---|---|---|
| | | Connection structure | Solder particles | | | | | | |
| Insulation resistance | Moisture absorption and heat resistance test | (1) | Initial | | A | A | A | | C |
| | | | After 100 hours | | A | B | B | | C |
| | | | After 500 hours | | A | B | B | | D |
| | | | After 1,000 hours | | A | B | B | | D |
| | | (2) | Initial | A | A | A | | | D |
| | | | After 100 hours | A | A | B | | | D |
| | | | After 500 hours | A | A | B | | | D |
| | | | After 1,000 hours | A | A | B | | | E |
| | | (3) | Initial | | A | | | C | |
| | | | After 100 hours | | A | | | C | |
| | | | After 500 hours | | A | | | C | |
| | | | After 1,000 hours | | A | | | D | |
| | | (4) | Initial | | A | | | D | |
| | | | After 100 hours | | B | | | D | |
| | | | After 500 hours | | B | | | E | |
| | | | After 1,000 hours | | B | | | E | |
| | | (5) | Initial | | | | | D | |
| | | | After 100 hours | | | | | D | |
| | | | After 500 hours | | | | | D | |
| | | | After 1,000 hours | | | | | E | |
| | | (6) | Initial | | | | | E | |
| | | | After 100 hours | | | | | E | |
| | | | After 500 hours | | | | | E | |
| | | | After 1,000 hours | | | | | E | |

TABLE 5-continued

|  |  |  |  | E |
|---|---|---|---|---|
| (7) | Initial |  |  | E |
|  | After 100 hours |  |  | E |
|  | After 500 hours |  |  | E |
|  | After 1,000 hours |  |  | E |

Production Examples 13 to 24

An anisotropic conductive film and a connection structure were produced in the same method as in Production Examples 1 to 12 except that the solder particles and base material produced in the same method as in Examples 25 to 36 were used. The evaluation results are shown in Tables 6 to 8.

TABLE 6

| | | | | Production Example 13 Example 25 | Production Example 14 Example 26 | Production Example 15 Example 27 | Production Example 16 Example 28 | Production Example 17 Example 29 | Production Example 18 Example 30 |
|---|---|---|---|---|---|---|---|---|---|
| | | Connection structure | Solder particles | | | | | | |
| Conduction resistance | Moisture absorption and heat resistance test | (1) | Initial |  |  |  |  |  |  |
| | | | After 100 hours |  |  |  |  |  |  |
| | | | After 500 hours |  |  |  |  |  |  |
| | | | After 1,000 hours |  |  |  |  |  |  |
| | | (2) | Initial |  |  |  |  |  |  |
| | | | After 100 hours |  |  |  |  |  |  |
| | | | After 500 hours |  |  |  |  |  |  |
| | | | After 1,000 hours |  |  |  |  |  |  |
| | | (3) | Initial |  |  | A | A | A | A |
| | | | After 100 hours |  |  | B | B | A | A |
| | | | After 500 hours |  |  | B | B | A | A |
| | | | After 1,000 hours |  |  | B | B | A | A |
| | | (4) | Initial |  |  | A | A | A | A |
| | | | After 100 hours |  |  | B | A | A | A |
| | | | After 500 hours |  |  | B | A | A | A |
| | | | After 1,000 hours |  |  | B | A | A | A |
| | | (5) | Initial | A | A | A | A | A | A |
| | | | After 100 hours | B | B | A | A | A | A |
| | | | After 500 hours | B | B | A | A | A | A |
| | | | After 1,000 hours | B | B | B | A | A | A |
| | | (6) | Initial | B | A | A | A | A | A |
| | | | After 100 hours | B | B | A | A | A | A |
| | | | After 500 hours | B | B | A | A | A | A |
| | | | After 1,000 hours | B | B | A | A | A | A |
| | | (7) | Initial | B | A | A | A | A | A |
| | | | After 100 hours | B | B | A | A | A | A |
| | | | After 500 hours | B | B | B | A | A | A |
| | | | After 1,000 hours | B | B | B | B | B | A |

| | | | | Production Example 19 Example 31 | Production Example 20 Example 32 | Production Example 21 Example 33 | Production Example 22 Example 34 | Production Example 23 Example 35 | Production Example 24 Example 36 |
|---|---|---|---|---|---|---|---|---|---|
| | | Connection structure | Solder particles | | | | | | |
| Conduction resistance | Moisture absorption and heat resistance test | (1) | Initial |  |  |  | A | A | A |
| | | | After 100 hours |  |  |  | A | A | A |
| | | | After 500 hours |  |  |  | A | A | A |
| | | | After 1,000 hours |  |  |  | A | A | B |
| | | (2) | Initial |  | A | A | A | A |  |
| | | | After 100 hours |  | B | A | A | A |  |
| | | | After 500 hours |  | B | A | A | A |  |
| | | | After 1,000 hours |  | B | A | B | B |  |
| | | (3) | Initial | A | A | A |  |  |  |
| | | | After 100 hours | A | A | A |  |  |  |
| | | | After 500 hours | A | A | A |  |  |  |
| | | | After 1,000 hours | A | A | A |  |  |  |
| | | (4) | Initial | A | A | A |  |  |  |
| | | | After 100 hours | A | A | A |  |  |  |
| | | | After 500 hours | A | A | A |  |  |  |
| | | | After 1,000 hours | A | A | B |  |  |  |
| | | (5) | Initial | A | A |  |  |  |  |
| | | | After 100 hours | A | A |  |  |  |  |
| | | | After 500 hours | A | B |  |  |  |  |
| | | | After 1,000 hours | A | B |  |  |  |  |

TABLE 6-continued

|   |   |   |
|---|---|---|
| (6) | Initial | A |
|   | After 100 hours | A |
|   | After 500 hours | A |
|   | After 1,000 hours | A |
| (7) | Initial | A |
|   | After 100 hours | A |
|   | After 500 hours | A |
|   | After 1,000 hours | A |

TABLE 7

| | Connection structure | Solder particles | | Production Example 13 Example 25 | Production Example 14 Example 26 | Production Example 15 Example 27 | Production Example 16 Example 28 | Production Example 17 Example 29 | Production Example 18 Example 30 |
|---|---|---|---|---|---|---|---|---|---|
| Conduction resistance | High temperature endurance test | (1) | Initial |  |  |  |  |  |  |
| | | | After 100 hours |  |  |  |  |  |  |
| | | | After 500 hours |  |  |  |  |  |  |
| | | | After 1,000 hours |  |  |  |  |  |  |
| | | (3) | Initial |  |  |  | A | A | A | A |
| | | | After 100 hours |  |  |  | B | A | A | A |
| | | | After 500 hours |  |  |  | B | A | A | A |
| | | | After 1,000 hours |  |  |  | B | B | A | A |
| | | (6) | Initial | A | A | A | A | A | A |
| | | | After 100 hours | B | A | A | A | A | A |
| | | | After 500 hours | B | A | A | A | A | A |
| | | | After 1,000 hours | B | B | B | B | A | A |

| | Connection structure | Solder particles | | Production Example 19 Example 31 | Production Example 20 Example 32 | Production Example 21 Example 33 | Production Example 22 Example 34 | Production Example 23 Example 35 | Production Example 24 Example 36 |
|---|---|---|---|---|---|---|---|---|---|
| Conduction resistance | High temperature endurance test | (1) | Initial |  |  |  | A | A | A |
| | | | After 100 hours |  |  |  | A | A | A |
| | | | After 500 hours |  |  |  | A | A | A |
| | | | After 1,000 hours |  |  |  | B | B | B |
| | | (3) | Initial | A | A | A |  |  |  |
| | | | After 100 hours | A | A | A |  |  |  |
| | | | After 500 hours | A | A | A |  |  |  |
| | | | After 1,000 hours | A | A | B |  |  |  |
| | | (6) | Initial | A |  |  |  |  |  |
| | | | After 100 hours | A |  |  |  |  |  |
| | | | After 500 hours | A |  |  |  |  |  |
| | | | After 1,000 hours | A |  |  |  |  |  |

TABLE 8

| | | Connection structure | Solder particles | | Production Example 13 Example 25 | Production Example 14 Example 26 | Production Example 15 Example 27 | Production Example 16 Example 28 | Production Example 17 Example 29 | Production Example 18 Example 30 |
|---|---|---|---|---|---|---|---|---|---|---|
| Insulation resistance | Moisture absorption and heat resistance test | | (1) | Initial |  |  |  |  |  |  |
| | | | | After 100 hours |  |  |  |  |  |  |
| | | | | After 500 hours |  |  |  |  |  |  |
| | | | | After 1,000 hours |  |  |  |  |  |  |
| | | | (2) | Initial |  |  |  |  |  |  |
| | | | | After 100 hours |  |  |  |  |  |  |
| | | | | After 500 hours |  |  |  |  |  |  |
| | | | | After 1,000 hours |  |  |  |  |  |  |
| | | | (3) | Initial |  |  |  | A | A | A | A |
| | | | | After 100 hours |  |  |  | A | A | A | A |
| | | | | After 500 hours |  |  |  | A | A | A | A |
| | | | | After 1,000 hours |  |  |  | A | A | A | B |

TABLE 8-continued

|  |  |  | | | | | |
|---|---|---|---|---|---|---|---|
| | (4) | Initial | | | A | A | A | A |
| | | After 100 hours | | | A | A | A | A |
| | | After 500 hours | | | A | A | A | A |
| | | After 1,000 hours | | | A | B | B | B |
| | (5) | Initial | A | A | A | A | A | A |
| | | After 100 hours | A | A | A | A | A | A |
| | | After 500 hours | A | A | A | A | A | A |
| | | After 1,000 hours | A | A | A | A | A | B |
| | (6) | Initial | A | A | A | A | A | A |
| | | After 100 hours | A | A | A | A | A | B |
| | | After 500 hours | A | A | A | A | A | B |
| | | After 1,000 hours | B | B | B | B | B | B |
| | (7) | Initial | A | A | A | A | | |
| | | After 100 hours | A | A | A | B | | |
| | | After 500 hours | A | A | A | B | | |
| | | After 1,000 hours | B | B | B | B | | |

| Connection structure | Solder particles | | | Production Example 19 Example 31 | Production Example 20 Example 32 | Production Example 21 Example 33 | Production Example 22 Example 34 | Production Example 23 Example 35 | Production Example 24 Example 36 |
|---|---|---|---|---|---|---|---|---|---|
| Insulation resistance | Moisture absorption and heat resistance test | (1) | Initial | | | | A | B | B |
| | | | After 100 hours | | | | A | B | B |
| | | | After 500 hours | | | | A | B | B |
| | | | After 1,000 hours | | | | B | B | B |
| | | (2) | Initial | | A | A | A | B | |
| | | | After 100 hours | | A | A | B | B | |
| | | | After 500 hours | | A | A | B | B | |
| | | | After 1,000 hours | | B | B | B | B | |
| | | (3) | Initial | A | A | A | | | |
| | | | After 100 hours | A | A | A | | | |
| | | | After 500 hours | B | A | A | | | |
| | | | After 1,000 hours | B | B | B | | | |
| | | (4) | Initial | A | A | A | | | |
| | | | After 100 hours | A | A | B | | | |
| | | | After 500 hours | A | A | B | | | |
| | | | After 1,000 hours | B | B | B | | | |
| | | (5) | Initial | A | B | | | | |
| | | | After 100 hours | A | B | | | | |
| | | | After 500 hours | A | B | | | | |
| | | | After 1,000 hours | B | B | | | | |
| | | (6) | Initial | B | | | | | |
| | | | After 100 hours | | | | | | |
| | | | After 500 hours | | | | | | |
| | | | After 1,000 hours | | | | | | |
| | | (7) | Initial | | | | | | |
| | | | After 100 hours | | | | | | |
| | | | After 500 hours | | | | | | |
| | | | After 1,000 hours | | | | | | |

Example 37

Solder particles were produced, collected and evaluated in the same manner as in Example 13 except that, in Step b1, a base material having a cross-sectional shape (a recess shape similar to that of (b) of FIG. 4) shown in FIG. 8, that is, having a plurality of recesses with a bottom diameter a of 0.6 μm, an opening diameter b1 of 1.0 μm, and an opening diameter b2 of 1.2 μm (when the opening part was viewed from the top, the bottom diameter a of 1.0 μmφ corresponded to the opening diameter b2 of 1.2 μmφ at the center) was used. The results are shown in Table 10.

Examples 38 to 48

Solder particles were produced, collected and evaluated in the same manner as in Example 37 except that the size of the recess was changed as shown in Table 9. The results are shown in Table 10.

TABLE 9

| | | Example 37 | Example 38 | Example 39 | Example 40 | Example 41 | Example 42 |
|---|---|---|---|---|---|---|---|
| Opening diameter b2 | μm | 1.2 | 1.7 | 2.3 | 3.3 | 4.3 | 5.3 |
| Opening diameter b1 | μm | 1 | 1.5 | 2 | 3 | 4 | 5 |
| Bottom diameter a | μm | 0.6 | 0.8 | 1.2 | 1.6 | 2 | 2 |
| Depth | μm | 1 | 1.5 | 2 | 3 | 4 | 5 |
| Interval | μm | 1 | 1.5 | 2 | 3 | 4 | 5 |

TABLE 9-continued

|  |  | Example 43 | Example 44 | Example 45 | Example 46 | Example 47 | Example 48 |
|---|---|---|---|---|---|---|---|
| Opening diameter b2 | μm | 6.3 | 12 | 18 | 30 | 38 | 48 |
| Opening diameter b1 | μm | 6 | 10 | 15 | 25 | 30 | 40 |
| Bottom diameter a | μm | 4 | 6 | 7 | 14 | 17 | 25 |
| Depth | μm | 6 | 10 | 15 | 15 | 15 | 15 |
| Interval | μm | 6 | 10 | 15 | 20 | 25 | 30 |

TABLE 10

|  |  | Example 37 | Example 38 | Example 39 | Example 40 | Example 41 | Example 42 |
|---|---|---|---|---|---|---|---|
| Average diameter B (Average particle diameter) | μm | 1 | 1.5 | 2 | 3 | 4 | 5 |
| Diameter A of flat portion | μm | 0.2 | 0.6 | 1.0 | 1.2 | 1.4 | 2.1 |
| C.V. value | % | 9.3 | 9.1 | 9.0 | 8.8 | 7.9 | 7.6 |
| Roundness |  | 0.93 | 0.93 | 0.93 | 0.93 | 0.93 | 0.93 |
| A/B | — | 0.20 | 0.40 | 0.50 | 0.40 | 0.35 | 0.42 |
| Y/X | — | 0.94 | 0.92 | 0.94 | 0.93 | 0.93 | 0.93 |

|  |  | Example 43 | Example 44 | Example 45 | Example 46 | Example 47 | Example 48 |
|---|---|---|---|---|---|---|---|
| Average diameter B (Average particle diameter) | μm | 6 | 10 | 15 | 20 | 25 | 30 |
| Diameter A of flat portion | μm | 3.0 | 5.3 | 6.2 | 7.5 | 8.3 | 9.4 |
| C.V. value | % | 6.5 | 5.0 | 4.4 | 4.2 | 3.9 | 3.2 |
| Roundness |  | 0.93 | 0.93 | 0.93 | 0.93 | 0.93 | 0.93 |
| A/B | — | 0.50 | 0.53 | 0.41 | 0.38 | 0.33 | 0.31 |
| Y/X | — | 0.92 | 0.93 | 0.92 | 0.90 | 0.89 | 0.89 |

In Examples 37 to 48, since the cross-sectional shape of the recess was narrowed toward the bottom in multiple steps, when the solder fine particles were dissolved and coalesced, they were easily united to one in the recess, the amount of the remaining solder fine particles was reduced, and thus the C.V. value tended to be lower. On the other hand, since the bottom of the recess was larger than the flat portion formed on the surface of the solder particles, the size of the flat portion did not change significantly. When the size of the bottom of the recess was very small, the flat portion on the surface of the solder particles may be affected.

Production Examples 25 to 24

An anisotropic conductive film and a connection structure were produced in the same method as in Production Examples 1 to 12 except that the solder particles and base material produced in the same method as in Examples 37 to 48 were used. The evaluation results are shown in Tables 11 to 13.

TABLE 11

| Connection structure | Solder particles |  |  | Production Example 25 Example 37 | Production Example 26 Example 38 | Production Example 27 Example 39 | Production Example 28 Example 40 | Production Example 29 Example 41 | Production Example 30 Example 42 |
|---|---|---|---|---|---|---|---|---|---|
| Conduction resistance | Moisture absorption and heat resistance test | (1) | Initial |  |  |  |  |  |  |
|  |  |  | After 100 hours |  |  |  |  |  |  |
|  |  |  | After 500 hours |  |  |  |  |  |  |
|  |  |  | After 1,000 hours |  |  |  |  |  |  |
|  |  | (2) | Initial |  |  |  |  |  |  |
|  |  |  | After 100 hours |  |  |  |  |  |  |
|  |  |  | After 500 hours |  |  |  |  |  |  |
|  |  |  | After 1,000 hours |  |  |  |  |  |  |
|  |  | (3) | Initial | A | A | A | A |  |  |
|  |  |  | After 100 hours | B | B | A | A |  |  |
|  |  |  | After 500 hours | B | B | A | A |  |  |
|  |  |  | After 1,000 hours | B | B | A | A |  |  |
|  |  | (4) | Initial | A | A | A | A |  |  |
|  |  |  | After 100 hours | B | A | A | A |  |  |
|  |  |  | After 500 hours | B | A | A | A |  |  |
|  |  |  | After 1,000 hours | B | A | A | A |  |  |

TABLE 11-continued

| | | | | | | | | | |
|---|---|---|---|---|---|---|---|---|---|
| | | (5) | Initial | A | A | A | A | A | A |
| | | | After 100 hours | B | B | A | A | A | A |
| | | | After 500 hours | B | B | A | A | A | A |
| | | | After 1,000 hours | B | B | B | A | A | A |
| | | (6) | Initial | B | A | A | A | A | A |
| | | | After 100 hours | B | B | A | A | A | A |
| | | | After 500 hours | B | B | A | A | A | A |
| | | | After 1,000 hours | B | B | A | A | A | A |
| | | (7) | Initial | B | A | A | A | A | A |
| | | | After 100 hours | B | B | A | A | A | A |
| | | | After 500 hours | B | B | B | A | A | A |
| | | | After 1,000 hours | B | B | B | B | B | A |

| | Connection structure | Solder particles | | Production Example 31 Example 43 | Production Example 32 Example 44 | Production Example 33 Example 45 | Production Example 34 Example 46 | Production Example 35 Example 47 | Production Example 36 Example 48 |
|---|---|---|---|---|---|---|---|---|---|
| Conduction resistance | Moisture absorption and heat resistance test | (1) | Initial | | | | A | A | A |
| | | | After 100 hours | | | | A | A | A |
| | | | After 500 hours | | | | A | A | A |
| | | | After 1,000 hours | | | | A | A | B |
| | | (2) | Initial | | A | A | A | A | |
| | | | After 100 hours | | B | A | A | A | |
| | | | After 500 hours | | B | A | A | A | |
| | | | After 1,000 hours | | B | A | B | B | |
| | | (3) | Initial | A | A | A | | | |
| | | | After 100 hours | A | A | A | | | |
| | | | After 500 hours | A | A | A | | | |
| | | | After 1,000 hours | A | A | A | | | |
| | | (4) | Initial | A | A | A | | | |
| | | | After 100 hours | A | A | A | | | |
| | | | After 500 hours | A | A | A | | | |
| | | | After 1,000 hours | A | A | B | | | |
| | | (5) | Initial | A | A | | | | |
| | | | After 100 hours | A | A | | | | |
| | | | After 500 hours | A | B | | | | |
| | | | After 1,000 hours | A | B | | | | |
| | | (6) | Initial | A | | | | | |
| | | | After 100 hours | A | | | | | |
| | | | After 500 hours | A | | | | | |
| | | | After 1,000 hours | A | | | | | |
| | | (7) | Initial | A | | | | | |
| | | | After 100 hours | A | | | | | |
| | | | After 500 hours | A | | | | | |
| | | | After 1,000 hours | A | | | | | |

TABLE 12

| | Connection structure | Solder particles | | Production Example 25 Example 37 | Production Example 26 Example 38 | Production Example 27 Example 39 | Production Example 28 Example 40 | Production Example 29 Example 41 | Production Example 30 Example 42 |
|---|---|---|---|---|---|---|---|---|---|
| Conduction resistance | High temperature endurance test | (1) | Initial | | | | | | |
| | | | After 100 hours | | | | | | |
| | | | After 500 hours | | | | | | |
| | | | After 1,000 hours | | | | | | |
| | | (3) | Initial | | | A | A | A | A |
| | | | After 100 hours | | | B | A | A | A |
| | | | After 500 hours | | | B | A | A | A |
| | | | After 1,000 hours | | | B | A | A | A |
| | | (6) | Initial | A | A | A | A | A | A |
| | | | After 100 hours | B | A | A | A | A | A |
| | | | After 500 hours | B | A | A | A | A | A |
| | | | After 1,000 hours | B | A | A | A | A | A |

TABLE 12-continued

|  |  |  |  | Production Example 31 Example 43 | Production Example 32 Example 44 | Production Example 33 Example 45 | Production Example 34 Example 46 | Production Example 35 Example 47 | Production Example 36 Example 48 |
|---|---|---|---|---|---|---|---|---|---|
|  |  | Connection structure | Solder particles |  |  |  |  |  |  |
| Conduction resistance | High temperature endurance test | (1) | Initial |  |  |  | A | A | A |
|  |  |  | After 100 hours |  |  |  | A | A | A |
|  |  |  | After 500 hours |  |  |  | A | A | A |
|  |  |  | After 1,000 hours |  |  |  | A | A | A |
|  |  | (3) | Initial | A | A | A |  |  |  |
|  |  |  | After 100 hours | A | A | A |  |  |  |
|  |  |  | After 500 hours | A | A | A |  |  |  |
|  |  |  | After 1,000 hours | A | A | A |  |  |  |
|  |  | (6) | Initial | A |  |  |  |  |  |
|  |  |  | After 100 hours | A |  |  |  |  |  |
|  |  |  | After 500 hours | A |  |  |  |  |  |
|  |  |  | After 1,000 hours | A |  |  |  |  |  |

TABLE 13

|  |  |  |  | Production Example 25 Example 37 | Production Example 26 Example 38 | Production Example 27 Example 39 | Production Example 28 Example 40 | Production Example 29 Example 41 | Production Example 30 Example 42 |
|---|---|---|---|---|---|---|---|---|---|
|  |  | Connection structure | Solder particles |  |  |  |  |  |  |
| Insulation resistance | Moisture absorption and heat resistance test | (1) | Initial |  |  |  |  |  |  |
|  |  |  | After 100 hours |  |  |  |  |  |  |
|  |  |  | After 500 hours |  |  |  |  |  |  |
|  |  |  | After 1,000 hours |  |  |  |  |  |  |
|  |  | (2) | Initial |  |  |  |  |  |  |
|  |  |  | After 100 hours |  |  |  |  |  |  |
|  |  |  | After 500 hours |  |  |  |  |  |  |
|  |  |  | After 1,000 hours |  |  |  |  |  |  |
|  |  | (3) | Initial |  |  |  | A | A | A |
|  |  |  | After 100 hours |  |  |  | A | A | A |
|  |  |  | After 500 hours |  |  |  | A | A | A |
|  |  |  | After 1,000 hours |  |  |  | A | A | A |
|  |  | (4) | Initial |  |  |  | A | A | A |
|  |  |  | After 100 hours |  |  |  | A | A | A |
|  |  |  | After 500 hours |  |  |  | A | A | A |
|  |  |  | After 1,000 hours |  |  |  | A | A | A |
|  |  | (5) | Initial | A | A | A | A | A | A |
|  |  |  | After 100 hours | A | A | A | A | A | A |
|  |  |  | After 500 hours | A | A | A | A | A | A |
|  |  |  | After 1,000 hours | A | A | A | A | A | A |
|  |  | (6) | Initial | A | A | A | A | A | A |
|  |  |  | After 100 hours | A | A | A | A | A | A |
|  |  |  | After 500 hours | A | A | A | A | A | B |
|  |  |  | After 1,000 hours | A | A | A | A | A | B |
|  |  | (7) | Initial | A | A | A | A |  |  |
|  |  |  | After 100 hours | A | A | A | A |  |  |
|  |  |  | After 500 hours | A | A | A | A |  |  |
|  |  |  | After 1,000 hours | A | A | A | B |  |  |

|  |  |  |  | Production Example 31 Example 43 | Production Example 32 Example 44 | Production Example 33 Example 45 | Production Example 34 Example 46 | Production Example 35 Example 47 | Production Example 36 Example 48 |
|---|---|---|---|---|---|---|---|---|---|
|  |  | Connection structure | Solder particles |  |  |  |  |  |  |
| Insulation resistance | Moisture absorption and heat resistance test | (1) | Initial |  |  |  | A | A | A |
|  |  |  | After 100 hours |  |  |  | A | A | A |
|  |  |  | After 500 hours |  |  |  | A | A | A |
|  |  |  | After 1,000 hours |  |  |  | A | B | B |
|  |  | (2) | Initial |  | A | A | A | A |  |
|  |  |  | After 100 hours |  | A | A | A | A |  |
|  |  |  | After 500 hours |  | A | A | A | A |  |
|  |  |  | After 1,000 hours |  | A | A | A | B |  |
|  |  | (3) | Initial | A | A | A |  |  |  |
|  |  |  | After 100 hours | A | A | A |  |  |  |
|  |  |  | After 500 hours | A | A | A |  |  |  |
|  |  |  | After 1,000 hours | A | A | A |  |  |  |

TABLE 13-continued

| | | | | | |
|---|---|---|---|---|---|
| (4) | Initial | A | A | A | |
| | After 100 hours | A | A | A | |
| | After 500 hours | A | A | A | |
| | After 1,000 hours | A | A | B | |
| (5) | Initial | A | A | | |
| | After 100 hours | A | A | | |
| | After 500 hours | A | A | | |
| | After 1,000 hours | A | B | | |
| (6) | Initial | A | | | |
| | After 100 hours | | | | |
| | After 500 hours | | | | |
| | After 1,000 hours | | | | |
| (7) | Initial | | | | |
| | After 100 hours | | | | |
| | After 500 hours | | | | |
| | After 1,000 hours | | | | |

Examples 49 to 51

Solder particles were produced, collected and evaluated in the same manner as in Example 13 except that, in Step a1, 10 g of Sn—Bi solder fine particles (Type 9 commercially available from 5N Plus, a melting point of 139° C.) having an average particle diameter of 3.0 μm and a C.V. value of 32% were used and the recess shown in Table 14 was used in Step b1. The results are shown in Table 15.

Examples 52 to 54

Solder particles were produced, collected and evaluated in the same manner as in Example 13 except that, in Step a1, 10 g of Sn—Bi solder fine particles (Type 10 commercially available from 5N Plus, a melting point of 139° C.) having an average particle diameter of 2.8 μm and a C.V. value of 28% were used, and the recess shown in Table 14 was used in Step b1. The results are shown in Table 15.

Production Examples 55 to 57

Solder particles were produced, collected and evaluated in the same manner as in Example 13 except that, in Step a1, 100 g of In—Sn solder fine particles (Type 8 commercially available from 5N Plus, a melting point of 120° C.) were immersed in distilled water and ultrasonically dispersed and then left, and the solder fine particles suspended in the supernatant were collected, and solder fine particles having an average particle diameter of 1.0 μm and a C.V. value of 40% were used, the recess shown in Table 14 was used in Step b1, and the following Step c2 was performed in place of Step c1. The results are shown in Table 15.
(Step c2: Formation of Solder Particles)

The base material in which the solder fine particles were disposed in the recesses in Step b1 was put into a hydrogen radical reduction furnace (plasma reflow device commercially available from Shinko Seiki Co., Ltd.), the furnace was evacuated, hydrogen gas was then introduced into the furnace, and the inside of the furnace was filled with hydrogen gas. Then, the temperature in the furnace was adjusted to 110° C. and hydrogen radicals were emitted for 5 minutes. Then, hydrogen gas in the furnace was removed by evacuation, heating was performed to 160° C., nitrogen was then introduced into the furnace to return to atmospheric pressure, the temperature in the furnace was then lowered to room temperature, and thereby solder particles were formed.

Production Examples 58 to 60

Solder particles were produced, collected and evaluated in the same manner as in Example 13 except that, in Step a1, 100 g of Sn—Ag—Cu solder fine particles (Type 8 commercially available from 5N Plus, a melting point of 219° C.) were immersed in distilled water and ultrasonically dispersed and then left, the solder fine particles suspended in the supernatant were collected, and solder fine particles having an average particle diameter of 1.0 μm and a C.V. value of 41% were used, the recess shown in Table 14 was used in Step b1, and the following Step c2 was performed in place of Step c1. The results are shown in Table 15.
(Step c2: Formation of Solder Particles)

The base material in which the solder fine particles were disposed in the recesses in Step b1 was put into a hydrogen radical reduction furnace (plasma reflow device commercially available from Shinko Seiki Co., Ltd.), the furnace was evacuated, hydrogen gas was then introduced into the furnace, and the inside of the furnace was filled with hydrogen gas. Then, the temperature in the furnace was adjusted to 150° C. and hydrogen radicals were emitted for 3 minutes. Then, hydrogen gas in the furnace was removed by evacuation, heating was performed to 240° C., nitrogen was then introduced into the furnace to return to atmospheric pressure, the temperature in the furnace was then lowered to room temperature, and thereby solder particles were formed.

TABLE 14

| | | Example 49 | Example 50 | Example 51 | Example 52 | Example 53 | Example 54 |
|---|---|---|---|---|---|---|---|
| Opening diameter | μm | 4.3 | 11 | 40 | 4.3 | 11 | 40 |
| Bottom diameter | μm | 4 | 10 | 40 | 4 | 10 | 40 |
| Depth | μm | 4 | 10 | 15 | 4 | 10 | 15 |
| Interval | μm | 4 | 10 | 30 | 4 | 10 | 30 |

TABLE 14-continued

|  |  | Example 55 | Example 56 | Example 57 | Example 58 | Example 59 | Example 60 |
|---|---|---|---|---|---|---|---|
| Opening diameter | μm | 4.3 | 11 | 40 | 4.3 | 11 | 40 |
| Bottom diameter | μm | 4 | 10 | 40 | 4 | 10 | 40 |
| Depth | μm | 4 | 10 | 15 | 4 | 10 | 15 |
| Interval | μm | 4 | 10 | 30 | 4 | 10 | 30 |

TABLE 15

|  |  | Example 49 | Example 50 | Example 51 | Example 52 | Example 53 | Example 54 |
|---|---|---|---|---|---|---|---|
| Average diameter B (Average particle diameter) | μm | 4.2 | 10 | 30 | 4.2 | 10 | 30 |
| Diameter A of flat portion | μm | 1.3 | 1.4 | 5.1 | 0.6 | 1.4 | 5.1 |
| C.V. value | % | 7.9 | 5.2 | 3.3 | 7.9 | 5.2 | 3.3 |
| Roundness |  | 0.93 | 0.93 | 0.95 | 0.93 | 0.93 | 0.95 |
| A/B |  | — | 0.15 | 0.14 | 0.17 | 0.15 | 0.14 | 0.17 |
| Y/X |  | — | 0.93 | 0.92 | 0.82 | 0.93 | 0.92 | 0.82 |

|  |  | Example 55 | Example 56 | Example 57 | Example 58 | Example 59 | Example 60 |
|---|---|---|---|---|---|---|---|
| Average diameter B (Average particle diameter) | μm | 4.2 | 10 | 30 | 4.2 | 10 | 30 |
| Diameter A of flat portion | μm | 0.6 | 1.4 | 5.1 | 0.6 | 1.4 | 5.1 |
| C.V. value | % | 7.4 | 5.0 | 3.2 | 6.1 | 4.9 | 3.1 |
| Roundness |  | 0.93 | 0.93 | 0.95 | 0.93 | 0.95 | 0.96 |
| A/B |  | — | 0.15 | 0.14 | 0.17 | 0.15 | 0.14 | 0.17 |
| Y/X |  | — | 0.93 | 0.92 | 0.82 | 0.93 | 0.92 | 0.82 |

In this manner, even if the sizes of the solder fine particles were different or materials were different, according to the present method, it was possible to produce solder particles having a uniform particle diameter.

Prototype Examples 37 to 39

An anisotropic conductive film and a connection structure were produced in the same method as in Prototype Example 1 except that the solder particles produced in the same method as in Examples 49 to 51 were used. The results are shown in Tables 16 to 18.

Prototype Examples 40 to 42

An anisotropic conductive film and a connection structure were produced in the same method as in Prototype Example 1 except that the solder particles produced in the same method as in Examples 52 to 54 were used. The results are shown in Tables 16 to 18.

Prototype Examples 43 to 45

An anisotropic conductive film and a connection structure were produced in the same method as in Prototype Example 1 except that the solder particles produced in the same method as in Examples 55 to 57 were used. The results are shown in Tables 16 to 18.

Prototype Examples 46 to 48

An anisotropic conductive film and a connection structure were produced in the same method as in Example 1 except that the solder particles produced in the same method as in Examples 58 to 60 were used, and in Step 11, the main compression temperature was set to 230° C. The results are shown in Tables 16 to 18.

TABLE 16

| Connection structure | Solder particles |  |  | Production Example 37 Example 49 | Production Example 38 Example 50 | Production Example 39 Example 51 | Production Example 40 Example 52 | Production Example 41 Example 53 | Production Example 42 Example 54 |
|---|---|---|---|---|---|---|---|---|---|
| Conduction resistance | Moisture absorption and heat resistance test | (1) | Initial |  |  |  | A |  | A |
|  |  |  | After 100 hours |  |  |  | A |  | A |
|  |  |  | After 500 hours |  |  |  | A |  | A |
|  |  |  | After 1,000 hours |  |  |  | A |  | A |
|  |  | (2) | Initial |  | A |  |  | A |  |
|  |  |  | After 100 hours |  | B |  |  | B |  |
|  |  |  | After 500 hours |  | B |  |  | B |  |
|  |  |  | After 1,000 hours |  | B |  |  | B |  |

TABLE 16-continued

| | | | | | | | | |
|---|---|---|---|---|---|---|---|---|
| | | (3) | Initial | A | A | | A | A |
| | | | After 100 hours | A | A | | A | A |
| | | | After 500 hours | A | A | | A | A |
| | | | After 1,000 hours | A | A | | A | A |
| | | (4) | Initial | A | A | | A | A |
| | | | After 100 hours | A | A | | A | A |
| | | | After 500 hours | A | A | | A | A |
| | | | After 1,000 hours | A | A | | A | A |
| | | (5) | Initial | A | A | | A | A |
| | | | After 100 hours | A | A | | A | A |
| | | | After 500 hours | A | A | | A | A |
| | | | After 1,000 hours | A | A | | A | A |
| | | (6) | Initial | A | | | A | |
| | | | After 100 hours | A | | | A | |
| | | | After 500 hours | A | | | A | |
| | | | After 1,000 hours | A | | | A | |
| | | (7) | Initial | A | | | A | |
| | | | After 100 hours | | | | | A | A |
| | | | After 500 hours | B | A | A | A | A | A |
| | | | After 1,000 hours | B | A | A | A | A | A |

| | | | | Production Example 43 Example 55 | Production Example 44 Example 56 | Production Example 45 Example 57 | Production Example 46 Example 58 | Production Example 47 Example 59 | Production Example 48 Example 60 |
|---|---|---|---|---|---|---|---|---|---|
| | Connection structure | Solder particles | | | | | | | |
| Conduction resistance | Moisture absorption and heat resistance test | (1) | Initial | | | A | | | A |
| | | | After 100 hours | | | A | | | A |
| | | | After 500 hours | | | A | | | A |
| | | | After 1,000 hours | | | A | | | A |
| | | (2) | Initial | | A | | | A | |
| | | | After 100 hours | | B | | | B | |
| | | | After 500 hours | | B | | | B | |
| | | | After 1,000 hours | | B | | | B | |
| | | (3) | Initial | A | A | | A | A | |
| | | | After 100 hours | A | A | | A | A | |
| | | | After 500 hours | A | A | | A | A | |
| | | | After 1,000 hours | A | A | | A | A | |
| | | (4) | Initial | A | A | | A | A | |
| | | | After 100 hours | A | A | | A | A | |
| | | | After 500 hours | A | A | | A | A | |
| | | | After 1,000 hours | A | A | | A | A | |
| | | (5) | Initial | A | A | | A | A | |
| | | | After 100 hours | A | A | | A | A | |
| | | | After 500 hours | A | A | | A | A | |
| | | | After 1,000 hours | A | A | | A | A | |
| | | (6) | Initial | A | | | A | | |
| | | | After 100 hours | A | | | A | | |
| | | | After 500 hours | A | | | A | | |
| | | | After 1,000 hours | A | | | A | | |
| | | (7) | Initial | A | | | A | | |
| | | | After 100 hours | A | | | | | |
| | | | After 500 hours | A | | | | | |
| | | | After 1,000 hours | A | | | | | |

TABLE 17

| | | | | Production Example 37 Example 49 | Production Example 38 Example 50 | Production Example 39 Example 51 | Production Example 40 Example 52 | Production Example 41 Example 53 | Production Example 42 Example 54 |
|---|---|---|---|---|---|---|---|---|---|
| | Connection structure | Solder particles | | | | | | | |
| Conduction resistance | High temperature endurance test | (1) | Initial | | | A | | | A |
| | | | After 100 hours | | | A | | | A |
| | | | After 500 hours | | | A | | | A |
| | | | After 1,000 hours | | | A | | | A |
| | | (3) | Initial | A | A | | A | A | |
| | | | After 100 hours | A | A | | A | A | |
| | | | After 500 hours | A | A | | A | A | |
| | | | After 1,000 hours | A | A | | A | A | |

TABLE 17-continued

| | | | | Production Example 43 Example 55 | Production Example 44 Example 56 | Production Example 45 Example 57 | Production Example 46 Example 58 | Production Example 47 Example 59 | Production Example 48 Example 60 |
|---|---|---|---|---|---|---|---|---|---|
| | | (6) | Initial | | | A | | A | |
| | | | After 100 hours | | | A | | A | |
| | | | After 500 hours | | | A | | A | |
| | | | After 1,000 hours | | | A | | A | |
| | | | | Production Example 43 Example 55 | Production Example 44 Example 56 | Production Example 45 Example 57 | Production Example 46 Example 58 | Production Example 47 Example 59 | Production Example 48 Example 60 |
| | | Connection structure | Solder particles | | | | | | |
| Conduction resistance | High temperature endurance test | (1) | Initial | | | A | | A | |
| | | | After 100 hours | | | A | | A | |
| | | | After 500 hours | | | A | | A | |
| | | | After 1,000 hours | | | A | | A | |
| | | (3) | Initial | A | A | | A | A | |
| | | | After 100 hours | A | A | | A | A | |
| | | | After 500 hours | A | A | | A | A | |
| | | | After 1,000 hours | A | A | | A | A | |
| | | (6) | Initial | A | | | A | | |
| | | | After 100 hours | A | | | A | | |
| | | | After 500 hours | A | | | A | | |
| | | | After 1,000 hours | A | | | A | | |

TABLE 18

| | | | | Production Example 37 Example 49 | Production Example 38 Example 50 | Production Example 39 Example 51 | Production Example 40 Example 52 | Production Example 41 Example 53 | Production Example 42 Example 54 |
|---|---|---|---|---|---|---|---|---|---|
| | Connection structure | Solder particles | | | | | | | |
| Insulation resistance | Moisture absorption and heat resistance test | (1) | Initial | | | A | | A | |
| | | | After 100 hours | | | B | | B | |
| | | | After 500 hours | | | B | | B | |
| | | | After 1,000 hours | | | B | | B | |
| | | (2) | Initial | | A | | | A | |
| | | | After 100 hours | | A | | | A | |
| | | | After 500 hours | | A | | | A | |
| | | | After 1,000 hours | | A | | | A | |
| | | (3) | Initial | A | A | | A | A | |
| | | | After 100 hours | A | A | | A | A | |
| | | | After 500 hours | A | A | | A | A | |
| | | | After 1,000 hours | A | A | | A | A | |
| | | (4) | Initial | A | A | | A | A | |
| | | | After 100 hours | A | A | | A | A | |
| | | | After 500 hours | A | A | | A | A | |
| | | | After 1,000 hours | A | A | | A | A | |
| | | (5) | Initial | A | A | | A | A | |
| | | | After 100 hours | A | B | | A | B | |
| | | | After 500 hours | A | B | | A | B | |
| | | | After 1,000 hours | A | B | | A | B | |
| | | (6) | Initial | A | | | A | | |
| | | | After 100 hours | A | | | A | | |
| | | | After 500 hours | A | | | A | | |
| | | | After 1,000 hours | A | | | A | | |
| | | | | Production Example 43 Example 55 | Production Example 44 Example 56 | Production Example 45 Example 57 | Production Example 46 Example 58 | Production Example 47 Example 59 | Production Example 48 Example 60 |
| | Connection structure | Solder particles | | | | | | | |
| Insulation resistance | Moisture absorption and heat resistance test | (1) | Initial | | | A | | A | |
| | | | After 100 hours | | | B | | B | |
| | | | After 500 hours | | | B | | B | |
| | | | After 1,000 hours | | | B | | B | |
| | | (2) | Initial | A | | | A | | |
| | | | After 100 hours | A | | | A | | |
| | | | After 500 hours | A | | | A | | |
| | | | After 1,000 hours | A | | | A | | |

TABLE 18-continued

| | | | | | | |
|---|---|---|---|---|---|---|
| (3) | Initial | A | A | | A | A |
| | After 100 hours | A | A | | A | A |
| | After 500 hours | A | A | | A | A |
| | After 1,000 hours | A | A | | A | A |
| (4) | Initial | A | A | | A | A |
| | After 100 hours | A | A | | A | A |
| | After 500 hours | A | A | | A | A |
| | After 1,000 hours | A | A | | A | A |
| (5) | Initial | A | A | | A | A |
| | After 100 hours | A | B | | A | B |
| | After 500 hours | A | B | | A | B |
| | After 1,000 hours | A | B | | A | B |
| (6) | Initial | A | | | A | |
| | After 100 hours | A | | | A | |
| | After 500 hours | A | | | A | |
| | After 1,000 hours | A | | | A | |

When the central particle diameter of the solder fine particles was smaller, the size of the recess was small (for example, a bottom of 2 μm or 3 μm), and after reduction and dissolution, the C.V. value of the obtained solder particles tends to be smaller. This is thought to be caused by the fact that, as the central particle diameter of the solder fine particles was smaller, the filling rate in the recess was higher, and the filling variation among the plurality of recesses was lower.

According to the present method, solder particles having a uniform particle diameter and different melting points were easily obtained by simply changing the composition of the solder fine particles. In addition, various cross-sectional shapes of the recesses could be used. That is, the cross-sectional shape of the recess could be appropriately selected according to the final usage method and form of the solder particles. For example, in a case of the solder particles were dispersed in the resin and flowability was secured like an ink, it is considered preferable for the surface of the solder particles to have a continuous curved surface. On the other hand, in a case of the solder particles were dispersed in the film and the solder particles were brought into contact with electrodes in a compression step, depending on the shape and material of the electrode, when the solder particles had a flat portion, an impact on the electrode during contact could be alleviated and damage to the electrode could be prevented. In addition, the resin whose viscosity was lowered due to heating in the compression step flowed and moved on the electrode. However, when the particles had a flat portion, since an area in contact with the electrode tended to be large and the particles quickly wet and spread on the electrode when the oxide film was removed by the flux, there was also an advantage of movement due to the resin flow being restricted. The same phenomenon was observed in the resin paste. In addition, when solder particles having a flat part in a part obtained in the present production example were transferred to the adhesive resin film or an adhesive resin was poured into a base material to form a film and the base material was then removed, in the film, directions of the flat parts of the solder particles could be aligned substantially the same direction. When electrodes were compressed and mounted using an adhesive resin film containing such solder particles, a surface of the flat part was brought into contact with the electrode made of a very thin or weak material, and thus electrode damage could be minimized. In addition, for electrodes on which wetting and spreading were unlikely to occur, a flat part was in contact with the surface during compression, and thus there was an advantage that wetting and spreading were more likely to occur due to removal of the oxide film of the solder particles than the point contact of the spherical surface. In actual use, configurations and materials of electrodes to be connected were generally different from each other, and as in this specification, the feature in which directions of, for example, the flat parts of the solder particles were substantially aligned was a feature in which a disposition position of the adhesive resin film was selected according to the electrode material, and more reliable connection could be realized.

Production Examples 49 to 51

The solder particles obtained in Examples 46, 47, and 48 were disposed on Au electrodes of 10 μm, 20 μm, 50 μm in length and width formed by sputtering through masks having opening parts of 6 μm, 14 μm, and 40 μm. A substrate on which the Au electrode was formed was tilted at 15 degrees, 20 degrees, 30 degrees, and 45 degrees, and a vibration was applied by hitting it with a metal spatula. When the surface of the electrode was observed after the vibration was applied, the solder particles remaining on the electrode were particles of which flat parts were in contact with the surface of the Au electrode.

In this manner, when the solder particles were disposed on the electrode as in the process of BGA connection and the like, the flat parts make it difficult for the solder particles to move on the electrode due to an impact such as vibration or wind.

REFERENCE SIGNS LIST

1 Solder particles
11 Flat portion
111 Solder fine particles
60 Base material
60a Surface
62 Recess
62a Bottom

The invention claimed is:
1. A solder particle having:
a flat portion on a part of a surface; and
a curved portion having a spherical crown shape, on the surface other than the flat portion,
a ratio (A/B) of a diameter A of the flat portion to a diameter B of the solder particle satisfies the following formula:

$$0.01 < A/B < 1.0.$$

2. The solder particle according to claim 1, having an average particle diameter of 1 to 30 μm and a C.V. value of 20% or less.

3. The solder particle according to claim 2,
wherein a quadrangle circumscribing a projected image of the solder particle is created by two pairs of parallel lines, and distances between opposite sides are set as X and Y, where Y<X, X and Y satisfy the following formula:

$$0.8 < Y/X < 1.0.$$

4. The solder particle according to claim 3, comprising at least one selected from the group consisting of tin, tin alloys, indium and indium alloys.

5. The solder particle according to claim 2, comprising at least one selected from the group consisting of tin, tin alloys, indium and indium alloys.

6. The solder particle according to claim 5, comprising at least one selected from the group consisting of In—Sn alloys, In—Sn—Ag alloys, In—Bi alloys, Sn—Au alloys, Sn—Bi alloys, Sn—Bi—Ag alloys, Sn—Ag—Cu alloys and Sn—Cu alloys.

7. The solder particle according to claim 1,
wherein a quadrangle circumscribing a projected image of the solder particle is created by two pairs of parallel lines, and distances between opposite sides are set as X and Y, where Y<X, X and Y satisfy the following formula:

$$0.8 < Y/X < 1.0.$$

8. The solder particle according to claim 7, comprising at least one selected from the group consisting of tin, tin alloys, indium and indium alloys.

9. The solder particle according to claim 8, comprising at least one selected from the group consisting of In—Sn alloys, In—Sn—Ag alloys, In—Bi alloys, Sn—Au alloys, Sn—Bi alloys, Sn—Bi—Ag alloys, Sn—Ag—Cu alloys and Sn—Cu alloys.

10. The solder particle according to claim 1, comprising at least one selected from the group consisting of tin, tin alloys, indium and indium alloys.

11. The solder particle according to claim 10, comprising at least one selected from the group consisting of In—Sn alloys, In—Sn—Ag alloys, In—Bi alloys, Sn—Au alloys, Sn—Bi alloys, Sn—Bi—Ag alloys, Sn—Ag—Cu alloys and Sn—Cu alloys.

\* \* \* \* \*